US009230669B2

(12) United States Patent
Jung et al.

(10) Patent No.: US 9,230,669 B2
(45) Date of Patent: Jan. 5, 2016

(54) MEMORY SYSTEM AND METHOD OF OPERATION THEREOF

(71) Applicants: Bong-Kil Jung, Seoul (KR); Hyung-Gon Kim, Gyeonggi-do (KR); Dae-Seok Byeon, Seongnam-si (KR)

(72) Inventors: Bong-Kil Jung, Seoul (KR); Hyung-Gon Kim, Gyeonggi-do (KR); Dae-Seok Byeon, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 209 days.

(21) Appl. No.: 14/154,641

(22) Filed: Jan. 14, 2014

(65) Prior Publication Data

US 2014/0198573 A1 Jul. 17, 2014

(30) Foreign Application Priority Data

Jan. 15, 2013 (KR) ........................ 10-2013-0004222

(51) Int. Cl.
*G11C 11/34* (2006.01)
*G11C 16/04* (2006.01)
*G11C 16/26* (2006.01)
*G11C 16/24* (2006.01)
*G11C 29/04* (2006.01)
*G06F 11/10* (2006.01)

(52) U.S. Cl.
CPC ............ *G11C 16/26* (2013.01); *G06F 11/1048* (2013.01); *G11C 16/24* (2013.01); *G11C 29/04* (2013.01); *G11C 2029/0409* (2013.01); *G11C 2029/0411* (2013.01)

(58) Field of Classification Search
CPC ........ G11C 16/24; G11C 16/26; G11C 29/04; G11C 2029/0409; G11C 2029/0411
USPC ........... 365/185.12, 185.25, 185.09, 195, 203
See application file for complete search history.

(56) References Cited

U.S. PATENT DOCUMENTS

| | | | |
|---|---|---|---|
| 6,711,051 B1 | 3/2004 | Poplevine et al. | |
| 7,995,409 B2 | 8/2011 | Rao | |
| 8,270,227 B2 | 9/2012 | Park et al. | |
| 2008/0123451 A1 | 5/2008 | Rao | |
| 2008/0159005 A1 | 7/2008 | Lee et al. | |
| 2009/0290429 A1 | 11/2009 | Dong et al. | |
| 2010/0232221 A1* | 9/2010 | Park | G11C 11/5642 365/185.03 |
| 2011/0035644 A1 | 2/2011 | Madan | |
| 2011/0122708 A1 | 5/2011 | Nazarian et al. | |
| 2013/0314989 A1* | 11/2013 | Wakisaka | G11C 11/5642 365/185.03 |
| 2013/0346677 A1* | 12/2013 | Park | G06F 12/0246 711/103 |

FOREIGN PATENT DOCUMENTS

KR 20100101896 A 9/2010

* cited by examiner

*Primary Examiner* — Toan Le
(74) *Attorney, Agent, or Firm* — Volentine & Whitt, PLLC

(57) ABSTRACT

A method of operating a memory system including a non-volatile memory device and a memory controller controlling the non-volatile memory device, includes reading data from a memory cell array in a unit of a page which includes a plurality of sectors; performing error correction decoding on the read data in a unit of a sector of the page; selecting at least one target sector which includes at least one uncorrectable error and selecting at least one pass sector wherein all errors of the pass sector are correctable by the error correction decoding; inhibiting precharging of bit-lines connected to the at least one pass sector while precharging target bit lines connected to the at least one target sector; and performing a read retry operation for data in the at least one target sector.

20 Claims, 24 Drawing Sheets

| SECTOR1 | SECTOR2 | SECTOR3 | SECTOR4 | ... | SECTOR8 |
|---------|---------|---------|---------|-----|---------|
| 1 ... 1 | 1 ... 1 | 0 ... 0 | 1 ... 1 | ... | 1 ... 1 |

| SECTOR1 | SECTOR2 | SECTOR3 | SECTOR4 | ... | SECTOR8 |
|---------|---------|---------|---------|-----|---------|
| 0 ... 0 | 0 ... 0 | 1 ... 1 | 0 ... 0 | ... | 0 ... 0 |

MEMORY SYSTEM AND METHOD OF OPERATION THEREOF

CROSS-REFERENCE TO RELATED APPLICATION

This application claims priority under 35 USC §119 to Korean Patent Application No. 10-2013-0004222, filed on Jan. 15, 2013, in the Korean Intellectual Property Office (KIPO), the content of which is herein incorporated by reference in its entirety.

BACKGROUND

1. Technical Field

Example embodiments relate generally to a semiconductor memory device, and more particularly to a memory system including a non-volatile memory device, and a memory controller, and a method of operating the same.

2. Description of the Related Art

A non-volatile memory device such as a flash memory device is one type of electrically erasable programmable read-only memory (EEPROM) where a plurality of memory areas are erased or programmed by one program operation. In a typical EEPROM, one memory area may be erased or programmed at a time. Accordingly, the flash memory device may operate at a rapid speed when systems using the flash memory device concurrently write and read data to and from different regions. All types of flash memory and EEPROMs become worn after the specific number of erase operations due to degradation of a charge storage device used to store data, and wear of an insulation layer surrounding the charge storage device.

The flash memory device stores information in a silicon chip without requiring power to retain information stored in the silicon chip. That is, even if power supplied to the silicon chip is shut off, the information is preserved without power consumption. Further, the flash memory device provides a rapid read access time, and resistance against physical shock. Due to these characteristics, the flash memory device has been extensively employed for data storage device in battery-powered devices.

SUMMARY

Some example embodiments provide a method of operating a memory system, capable of reducing power consumption.

Some example embodiments provide a memory system, capable of reducing power consumption.

According to some example embodiments, a method is provided for operating a memory system including a non-volatile memory device and a memory controller controlling the non-volatile memory device. The method may include reading data from the memory cell array in a unit of a page which includes a plurality of sectors; performing error correction decoding on the read data in a unit of a sector of the page; selecting at least one target sector which includes at least one uncorrectable error in the read data thereof, and selecting at least one pass sector, wherein all errors of the read data of the pass sector are correctable by the error correction decoding; inhibiting precharging of bit-lines connected to the at least one pass sector while precharging target bit lines connected to the at least one target sector; and performing a read retry operation for data stored in the at least one target sector.

In an embodiment, each sector stores one or more parity bits generated based on the data stored in the sectors, wherein a number of errors included in the at least one target sector may be greater than a number of the parity bits and a number of errors included in the at least one pass sector may be less than or equal to the number of the parity bits.

In an embodiment, the read retry operation for the read data stored in the at least one target sector may be repeated until the uncorrectable errors are corrected by the error correction decoding.

In an embodiment, the read retry operation for the data in the at least one target sector may be repeated a preset reference number of times.

The method may further include performing an erase refresh operation to copy a memory block which includes the at least one target sector to another memory block when the read retry operation for the data stored in the at least one target sector may be repeated more than the preset reference number of times and to erase the memory block which includes the at least one target sector.

In an embodiment, the at least one target sector may be selected as the memory controller inputs a pattern of data, which is different from a pattern of data input into memory cells of other sectors of the page except for the target sector, into memory cells included in the target sector.

Data values of "0" may be input into the memory cells included in the target sector and data values of "1" may be input into the memory cells included in the other sectors.

In an embodiment, sizes of the sectors may be set according to a set feature command by the memory controller, respectively.

The sizes of the sectors may be set using at least a part of data transmitted to the non-volatile memory device after the set feature command.

In an embodiment, sizes of the sectors may be stored in a fuse unit included in the non-volatile memory device through a fuse option at a wafer level or a package level, and may be set according to data stored in the fuse unit during a power-up sequence of the non-volatile memory device.

In an embodiment, the memory controller may provide a sector selection command and a sector address to the non-volatile memory device for selecting the at least one target sector.

According to some example embodiments, a memory system includes a non-volatile memory device and a memory controller configured to control the non-volatile memory device. The memory controller includes an error correction code block configured to read data from the non-volatile memory device in a unit of a page including a plurality of sectors, and configured to perform error correction decoding on the read data in a unit of a sector of the page; and a control block configured to select at least one target sector that includes at least one uncorrectable error and to select at least one pass sector wherein all errors of the pass sector are correctable through the error correction decoding, the control block also being configured to control the nonvolatile memory device to inhibit precharging of bit lines connected to the at least one pass sector while precharging target bit lines connected to the at least one target sector, and the control block further being configured to perform a read retry operation for data in the at least one target sector.

In an embodiment, the error correction block may provide to the control block a flag signal which indicates success or failure of the error correction decoding performed for each sector.

The control block may include a sector table that stores a sector number of the sectors and flag signals for the sectors.

In an embodiment, the flash memory device may include a control logic, wherein the control logic may include a register that stores sector size information included in a set feature command provided from the memory controller, and wherein the control logic sets sizes of the sectors according to the sector size information.

According to some other example embodiments, a method is provided for operating a memory system including a non-volatile memory device and a memory controller controlling the non-volatile memory device, wherein the non-volatile memory device includes a plurality of memory cells organized into a plurality of pages each of which includes a plurality of sectors for storing data therein. The method may comprise: reading data from a selected page of the non-volatile memory device; performing error correction decoding on the read data on a sector-by-sector basis for each of the sectors of the selected page; and when the error correction decoding is unable to correct at least one data error of at least one target sector of the selected page but is able to correct all data errors of one or more pass sectors of the selected page, transmitting a target sector selection command from the memory controller to the non-volatile memory device. The target sector selection command may cause the non-volatile memory device to: change a voltage to applied to the memory cells of the at least one target sector, precharge target bit lines connected to the at least one target sector while inhibiting precharging of bit lines connected to the one or more pass sectors, and perform a read retry operation for data stored in the at least one target sector with the changed voltage.

Accordingly, the memory controller may perform read operation on the memory cell array in a unit of page, perform error detection and correction on the read data in a unit of a sector, inhibit precharge of bit-lines connected to at least one pass sector including correctable errors while precharging target bit lines connected to at least one target sector including uncorrectable errors, and perform a read retry operation for data in the at least one target sector, thereby reducing power consumption.

BRIEF DESCRIPTION OF THE DRAWINGS

Illustrative, non-limiting example embodiments will be more clearly understood from the following detailed description taken in conjunction with the accompanying drawings.

FIGS. 15B and 15C illustrate example input data patterns for setting the target sector according to example embodiments.

DETAILED DESCRIPTION OF THE EMBODIMENTS

Figure 1:
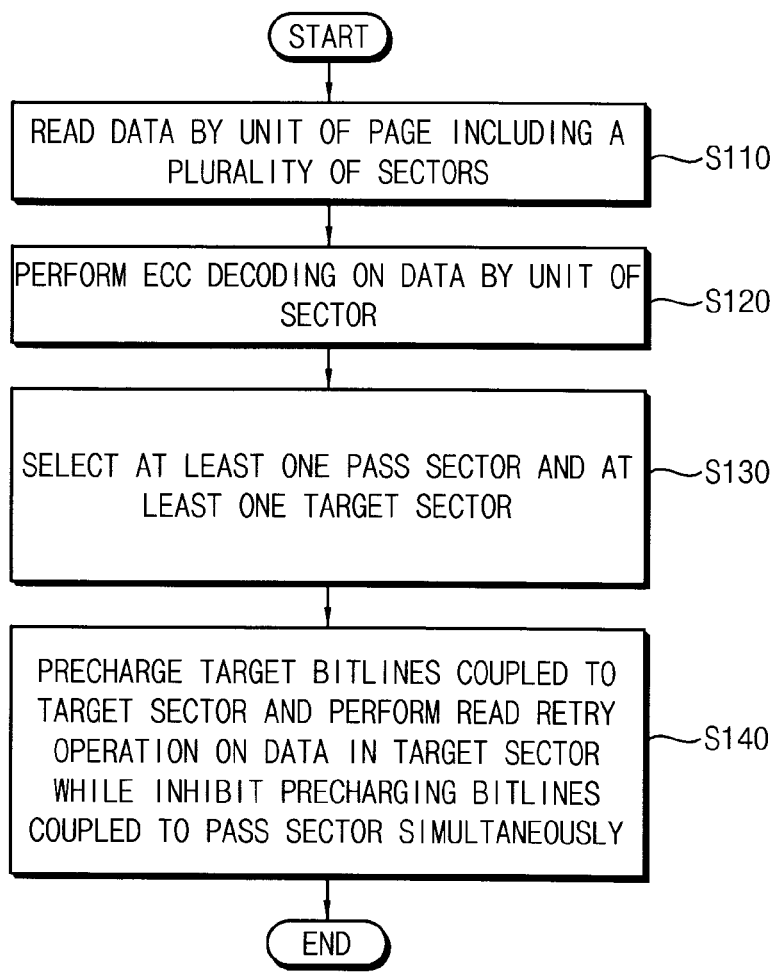
FIG. 1 is a flowchart illustrating a method of operating a memory system including a non-volatile memory device and a memory controller according to example embodiments.

Various embodiments of the inventive concept will now be described in some additional detail with reference to the accompanying drawings. This inventive concept may, however, be embodied in many different forms and should not be construed as being limited to only the illustrated embodiments. Rather, these embodiments are provided so that this disclosure will be thorough and complete and will fully convey the scope of the inventive concept to those skilled in the art. Throughout the written description and drawings, like reference numbers refer to like or similar elements and features.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described with reference to accompanying drawings. The same reference numerals will be used to refer to the same elements throughout the drawings and detailed description about the same elements will be omitted in order to avoid redundancy.

FIG. 1 is a flowchart illustrating a method of operating a memory system including a non-volatile memory device and a memory controller according to example embodiments. Here, it is assumed that the non-volatile memory device includes a memory cell array for storing data therein. The memory cell array may include a plurality of blocks which each store data therein. Each of the blocks may include a plurality of pages which each store data therein. Each of the pages may include a plurality of sectors which each store data therein.

Referring to FIG. 1, in an operation (S110) of the method of operating a memory system including a non-volatile memory device and a memory controller for controlling the non-volatile memory device, data are read from a memory cell array of the non-volatile memory device in a unit of a page including a plurality of sectors.

In an operation S120, an error correction code (hereinafter, referred to as 'ECC') block of the memory controller performs ECC decoding in a unit of a sector for the read data in a unit of a page. It can be determined whether read data includes a read error through the ECC decoding. The ECC block may notify a central processing unit (CPU) including the memory controller of whether a read error is correctable or uncorrectable in a unit of a sector (i.e., on a sector-by-sector basis) based on the ECC decoding. Based on the notification, in an operation (S130) the memory controller may select at least one target sector including at least one uncorrectable read error and capable of performing a reading retry operation, and at least one pass sector wherein any errors in the read data of the pass sector(s) are correctable. In order to select the one target sector, the memory controller may input the same data to memory cells included in the target sector. The same data may include data values of "0". In order to select the one target sector, the memory controller may use a target sector selection command.

In an operation (S140) the memory controller may control the non-volatile memory device to inhibit precharge of bit-lines connected to the pass sector(s) while precharging only target bit lines connected to the target sector, and may perform a read retry operation for data in the target sector. The read retry operation may be repeated until all read errors in the target sector are corrected. Further, the read retry operation may be repeatedly performed a predetermined number of times. When the read retry operation is repeatedly performed more than the predetermined number of times, an erase refresh operation for a memory block including the target sector may be performed.

In the memory system of the related art, when an uncorrectable read error occurs in one sector included in one page, all bit lines connected to the one page are precharged and then the read retry operation for sectors having the uncorrectable read error is performed, so power consumption is increased. However, in the example embodiments, only the bit lines connected to the target sector of a page are precharged so that power consumption can be reduced.

Figure 2A:
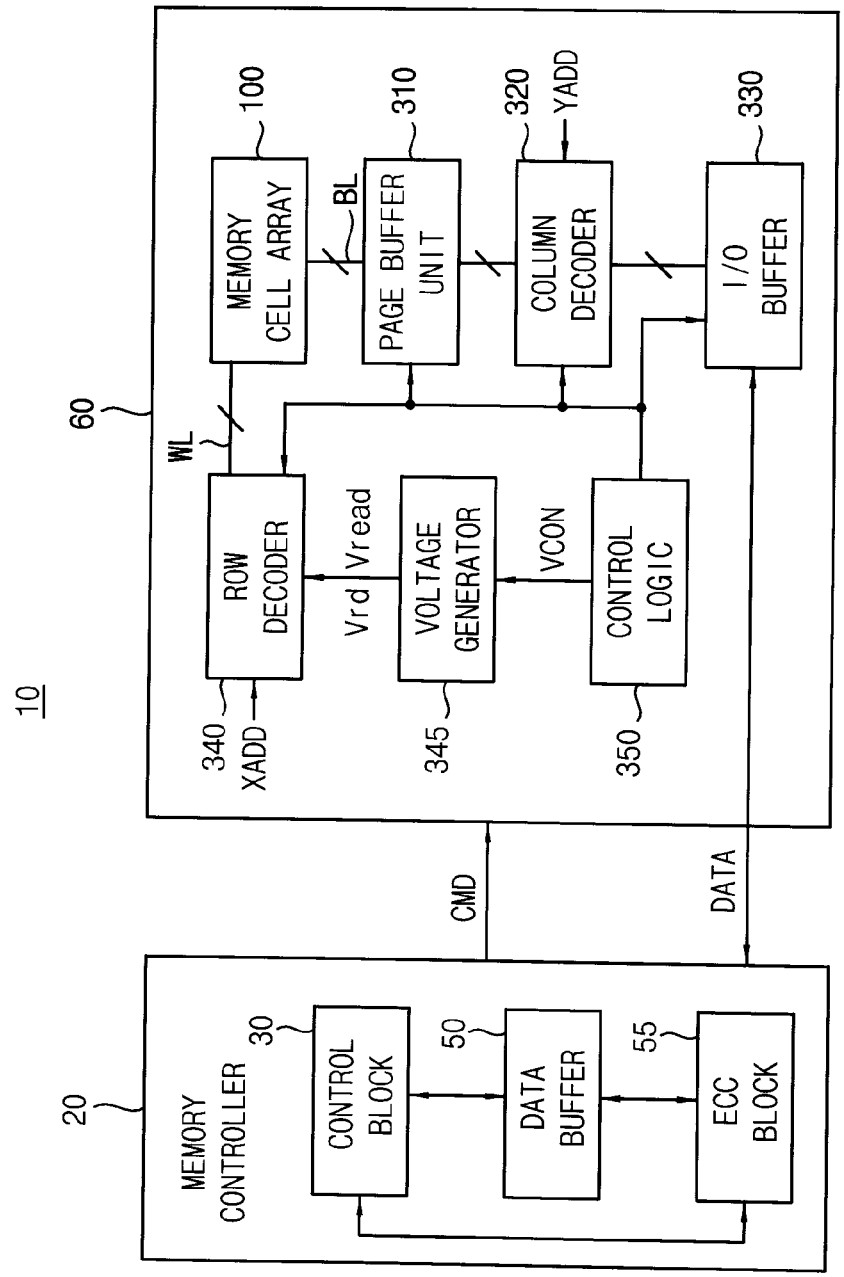
FIG. 2A is a block diagram illustrating a configuration of a memory system according to example embodiments.

FIG. 2A is a block diagram illustrating a configuration of a memory system 100 according to example embodiments.

Referring to FIG. 2A, memory system 100 may include a memory controller 20 and a non-volatile memory device 60.

Non-volatile memory device 60 may be a flash memory device, and may include a memory cell array 100, a page buffer unit 310, a column selection circuit or decoder 320, a row selection circuit or decoder 340, an input/output buffer 330, a voltage generator 345, and a control logic 350.

Control logic 350 may control an operation of non-volatile memory device 60 for an access operation, for example, a program operation, an erase operation, and a read operation under the control of memory controller 20.

Memory cell array 100 includes a plurality of memory cells connected to a plurality of word lines WL and a plurality of bit lines BL. As will be described below with reference to FIGS. 3 to 8, each of the memory cells may include a NAND or NOR flash memory cell, and the memory cells may be arranged in a two-dimensional array structure or a three-dimensional array structure.

In the example embodiments, each of the memory cells may include a single level memory cell (SLC) for storing one data bit and a multi-level memory cell (MLC) for storing a plurality data bits. In a case of the MLC, a program scheme in a write mode may include various program schemes such as a shadow program scheme, a reprogram scheme, or an on-chip buffered program scheme.

Control logic 350 is configured to control an overall operation of non-volatile memory device 60. Voltage generator 345 generates read voltage signals, that is, a selection read voltage Vrd and a non-selection read voltage Vread according to a control signal CTR from control logic 350 and provides the read voltage signals to row selection circuit 340 so that a read operation with respect to memory cell array 100 may be performed. Further, voltage generator 345 varies a level of the selection read voltage Vrd according to the control signal CTR from control logic 350 so that the read retry operation for data of the target sector may be performed. Row selection circuit 340 is controlled by control logic 350, and is configured to select and drive the rows of memory cell array 100 in response to a row address XADD and the selection read voltage Vrd.

Page buffer unit 310 is controlled by control logic 350 and serves as a sense amplifier or a write driver according an operation mode. For example, during a read operation, page buffer unit 310 operates as the sense amplifier for sensing data from memory cells in a selected row. During a program operation, page buffer unit 310 may operate as a write driver for driving memory cells in a selected row according to program data. Further, page buffer unit 310 may selectively precharge only bit lines connected to the target sector including an uncorrectable read error under control of control logic 350 during the read retry operation. Page buffer unit 310 may include page buffers corresponding to bit lines or bit line pairs, respectively. When each of the memory cells stores multi-bit data, each page buffer of page buffer unit 310 may be configured to include at least two latches.

Column selection circuit 320 is controlled by control logic 350, and sequentially selects columns (or page buffers) during read/program operations in response to a column address YADD in a predetermined unit. Input/output (I/O) buffer 300 transmits data of page buffer unit 310 from column selection circuit 320 to memory controller 20.

Referring back to FIG. 2A, memory controller 20 may include a control block 30, a data buffer 50, and an ECC block 55.

Whenever non-volatile memory device 60 performs the read operation, ECC block 55 determines whether error correction decoding of the read data succeeds in a unit of a sector (i.e., on a sector-by-sector basis) constituting one page with respect to data DATA provided from non-volatile memory device 60, and outputs to control block 30 a flag signal indicating the result of the error correction decoding for each sector. Control block 30 may provide a command CMD for controlling an operation of control logic 350 so that the read retry operation for the target sector including the uncorrectable error may be performed in response to the flag signal.

For example, non-volatile memory device 60 transmits first data in a unit of a page (i.e., on a page-by-page basis), which are output according to a first read voltage from memory cell array 100, to the data buffer 50 of memory controller 20 during the read operation. ECC block 55 performs ECC decoding in a unit of a sector (i.e., on a sector-by-sector basis) with respect to the transmitted data in a unit of a page, and determines whether the ECC decoding succeeds for each sector.

One page includes a plurality of sectors. Each of the sectors stores data which has been processed for error detection and correction. For example, in some embodiments each sector stores the data together with an error correction code comprising one or more error correction bits which have been generated based on the data according to an error correction code. In an example embodiment, the error correction bit(s) may comprise one or more parity bits which may form a parity value. ECC block 55 determines whether the ECC decoding succeeds for each sector with reference to the parity bits. For example, when the number of error bits included in each of the sectors included in the one page is less than or equal to the number of error bits correctable by ECC block 55, ECC block 55 may detect and correct the error bits in a unit of a sector, and may transmit error corrected data to a host. If the read operation for the first data succeeds, a first read operation is terminated.

However, when the number of error bits included in at least one sector among the sectors included in the one page is greater than the number of error bits correctable by ECC block 55, that is, when the ECC decoding for the at least one sector fails, ECC block 55 transmits to control block 30 a sector number including a correctable error bit and a flag signal indicating that error correction fails. Control block 30 controls the operation of non-volatile memory device 60 so that the read retry operation for a sector including the correctable error bit may be performed in response to the flag signal.

Accordingly, non-volatile memory device 60 performs the read retry operation for data of the sector including the correctable error bit while varying a read voltage under the control of memory controller 20 until the ECC decoding for the data of the sector succeeds. In this case, the read retry operation performed by non-volatile memory device 60 and the error detection/correction operations performed by memory controller 20 may be concurrently achieved. ECC block 55 performs error detection and error correction for data output through the read retry operation as well as data output through the read operation.

According to example embodiments, in order to prevent the read retry operation from being performed through an infinite loop, the read retry operation may be limited to being performed for only a predetermined number of times.

Figure 2B:
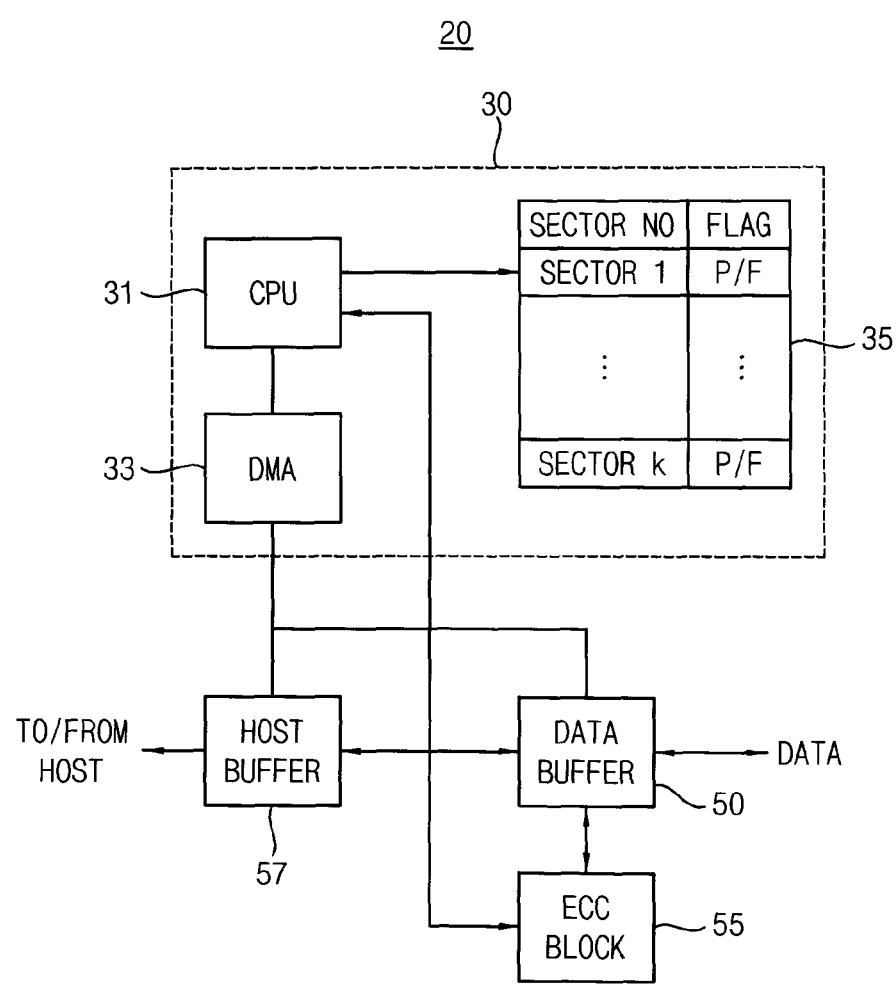
FIG. 2B is a block diagram illustrating a detailed configuration of a memory controller shown in FIG. 2B according to example embodiments.

FIG. 2B is a block diagram illustrating a detailed configuration of a memory controller shown in FIG. 2A according to example embodiments.

Referring to FIG. 2B, memory controller 20 may include control block 30, data buffer 50, ECC block 55, and host buffer 57. Control block 30 may include a direct memory access (DMA) 33, and a sector table 35.

ECC block 55 and DMA 33 may perform a function of a detection block capable of determining whether a read operation for data firstly output from memory cell array 100 succeeds or fails in every read operation.

For example, ECC block 55 may perform ECC decoding in a unit of a sector (i.e., on a sector-by-sector basis) for the first output data which is read in a unit of a page, and may provide the ECC decoding result to CPU 31 as a flag signal. DMA 33 may determine whether error-corrected data have been transmitted to the host as ECC block 55 may control transmission of the error corrected data from data buffer 50 to host buffer 57.

For example, the success of the read operation for the first output data may signify a state where the first output data from memory cell array 100 are transmitted to the host or a state where the transmission of the first output data is completed.

CPU 31 may update a flag field FLAG of sector table 35 according to the flag signal. Sector table 35 includes, as an entry, a sector number SECTOR NO indicating numbers of sectors included in a page subject to the read operation, and a flag signal FLAG indicating whether the ECC decoding for each sector succeeds. The flag signal FLAG may be written as pass P or fail F according to whether the ECC decoding for each sector succeeds. For example, the pass P may be at a high level (e.g., logic "1") and fail F may be at a low level (e.g., logic "0"). Although it has illustrated in FIG. 2B for the purpose of convenience of illustration that sector table 35 is separated from CPU 31, sector table 35 may be implemented as a part of CPU 31. In this case, sector table 35 may be provided as a volatile memory such as a synchronous random access memory (SRAM).

CPU 31 may generate a command CMD with information for performing the read retry operation for the target sector including an uncorrectable error using information stored in sector table 35 and transmit the generated command CMD to control logic 350.

Accordingly, control logic 350 may generate a voltage control signal VCON according to the information included in the received command CMD and provides the generated voltage control signal VCON to voltage generator 345. In response to the voltage control signal VCON, voltage generator 345 varies a level of the selection read voltage Vrd and supplies the selection read voltage Vrd to row selection circuit 340 so that the read retry operation for the target sector may be performed. Accordingly, page buffer unit 310 may read data stored in the target sector of memory cell array 100 using the varied selection read voltage Vrd. The data read by page buffer unit 310 are transmitted to input/output buffer 300 according to a decoding result of column selection circuit 320 and then are transmitted to ECC block 55 through data buffer

50. ECC block 55 may determine whether ECC decoding for data re-read from the target sector succeeds under control of CPU 31.

FIGS. 3 through 8 are diagrams illustrating examples of certain memory cell arrays that might be incorporated in the nonvolatile memory device of FIG. 2A.

Figure 3:
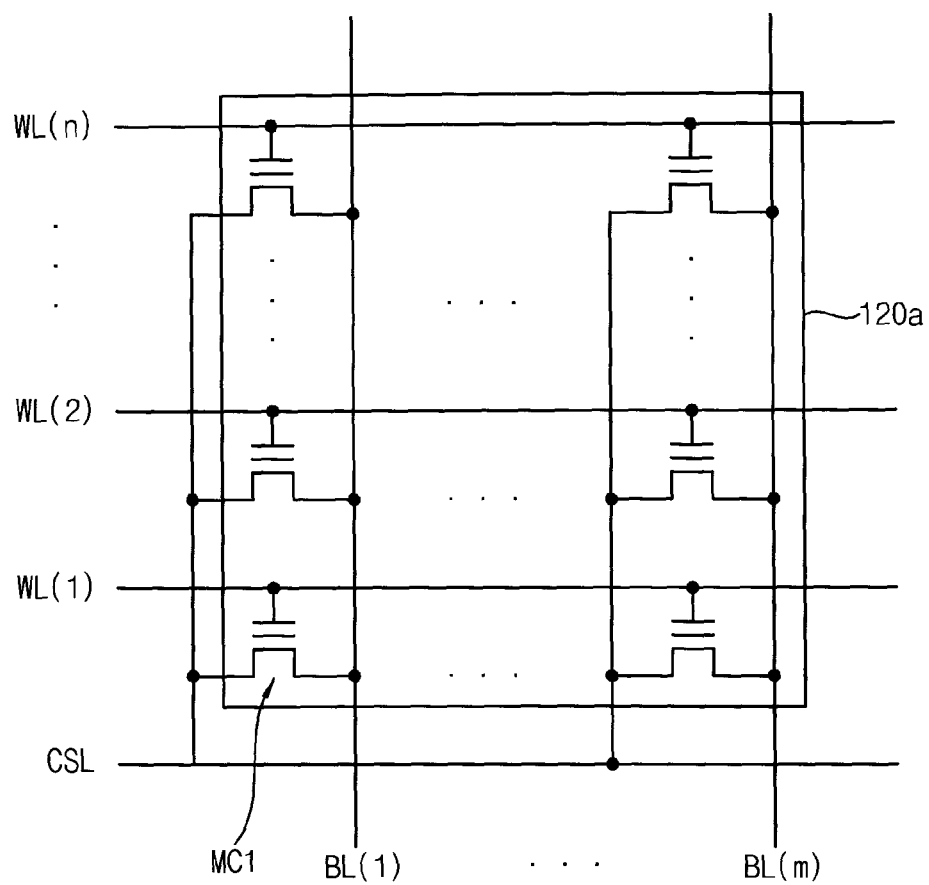
FIGS. 3 through 8 are diagrams illustrating examples of certain memory cell arrays that might be incorporated in the nonvolatile memory device of FIG. 2A.
Figure 4:
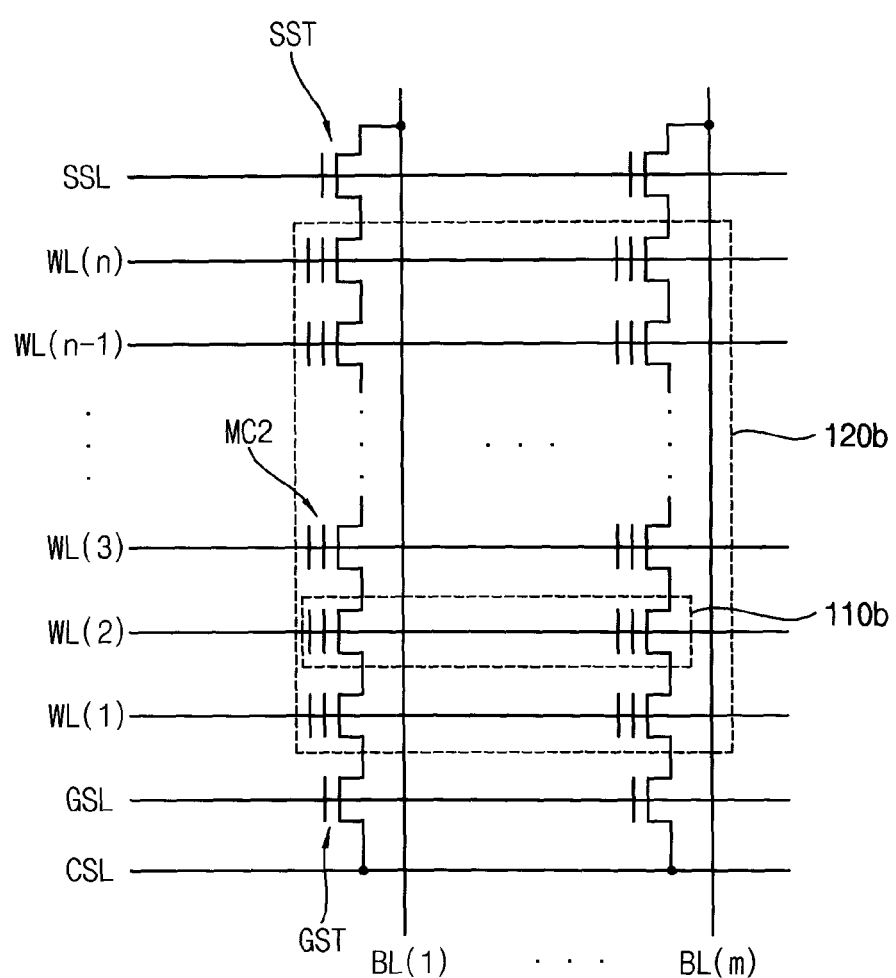
Figure 5:
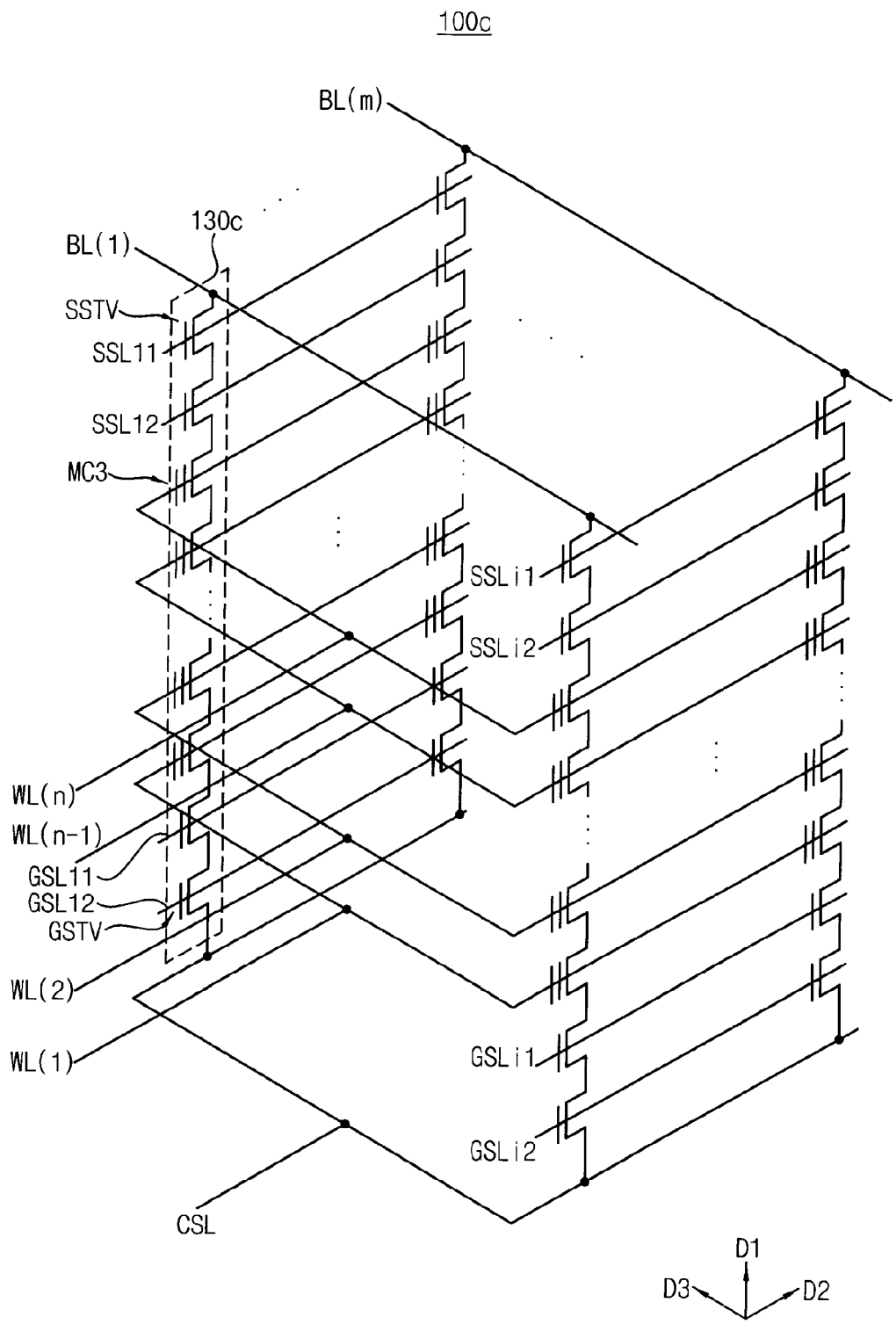
Figure 6:
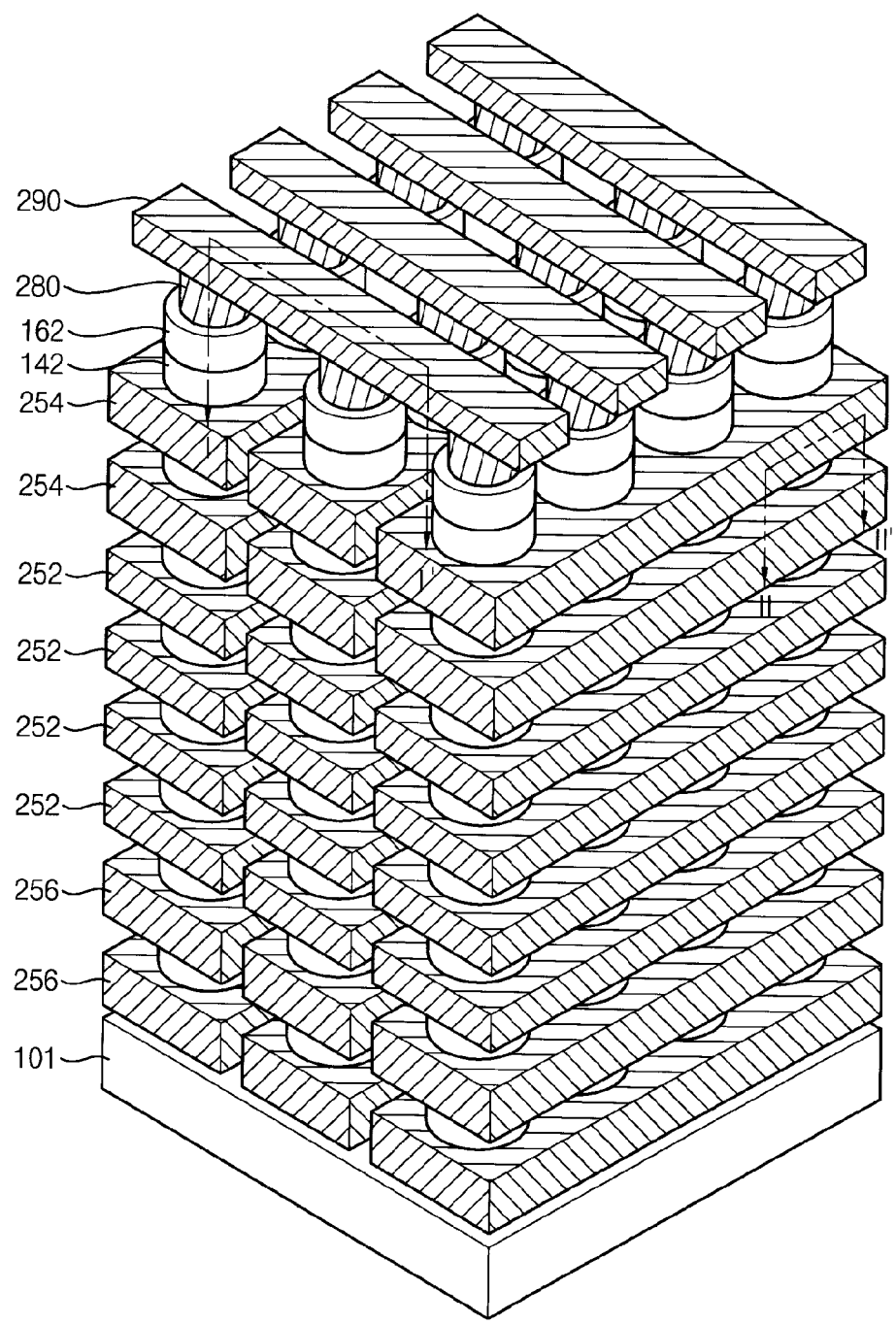
Figure 6:
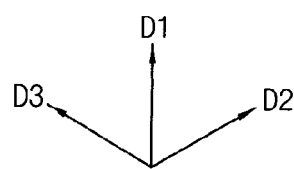
Figure 7:
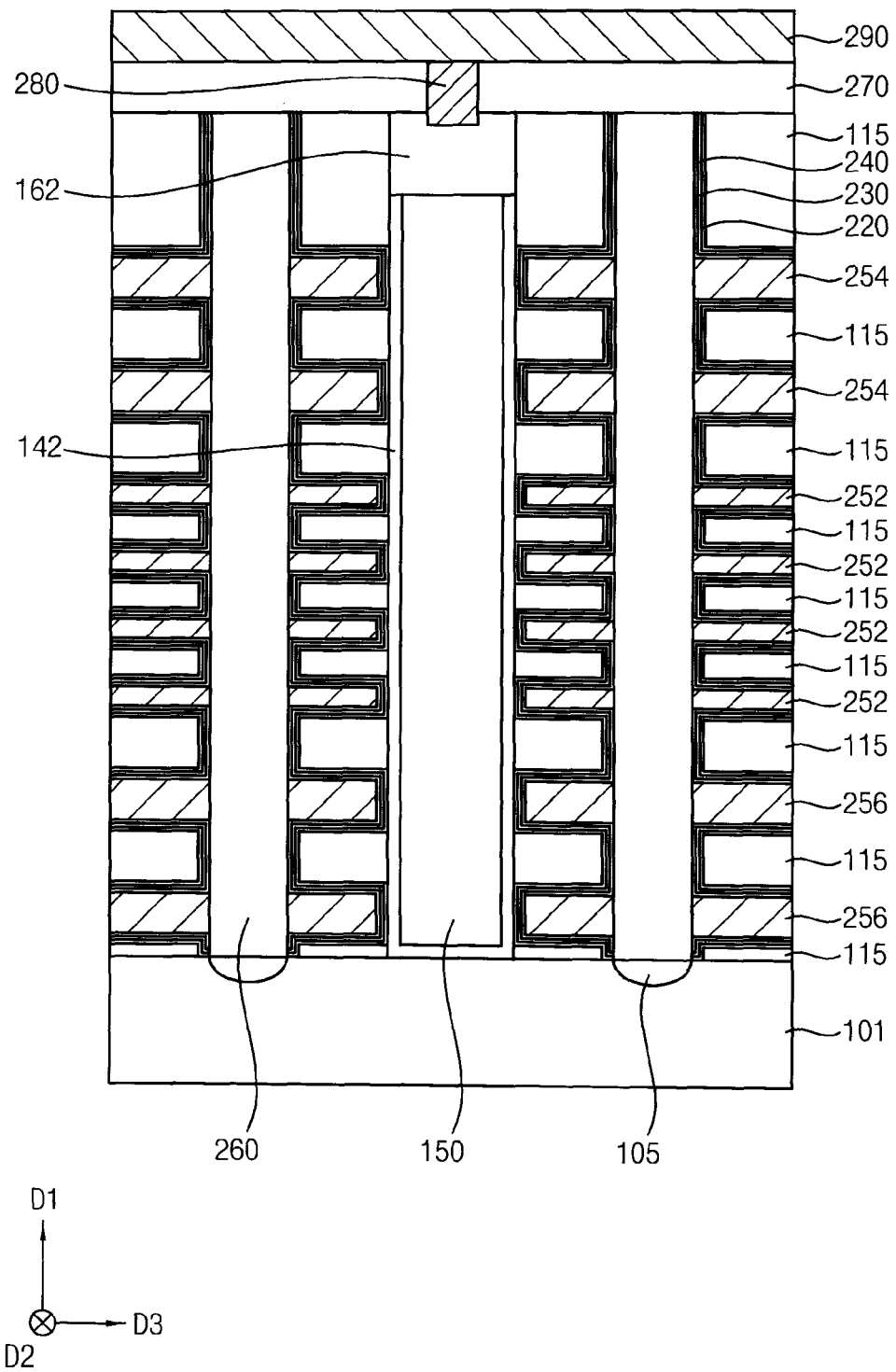
Figure 8:
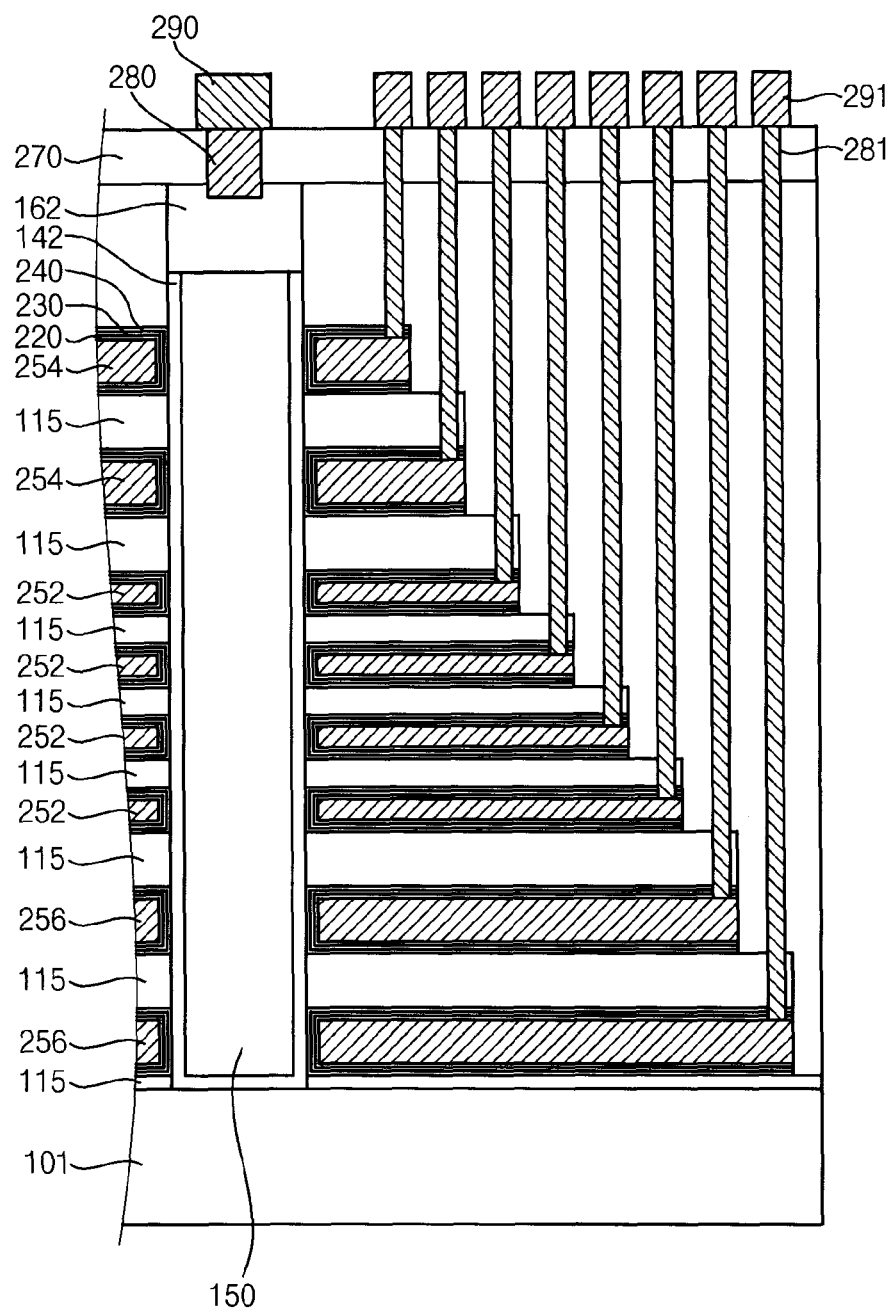

FIG. 3 is a circuit diagram illustrating a memory cell array included in a NOR flash memory device. FIG. 4 is a circuit diagram illustrating a memory cell array included in a NAND flash memory device. FIG. 5 is a circuit diagram illustrating a memory cell array included in a vertical flash memory device. FIG. 6 is a perspective diagram for describing the vertical flash memory device. FIG. 7 is a cross-sectional view of the vertical flash memory device of FIG. 6 cut along the line I-I'. FIG. 8 is a cross-sectional view of the vertical flash memory device of FIG. 6 cut along the line II-IF.

Referring to FIG. 3, a memory cell array 100a may include a plurality of memory cells MC1. Memory cells in the same column may be connected in parallel between a common source line CSL and one of a plurality of bit-lines BL(1), . . . , BL(m). Memory cells in the same row may be commonly connected to the same word-line among a plurality of word-lines WL(1), . . . , WL(n). For example, memory cells in a first column may be connected in parallel between a first bit-line BL(1) and the common source line CSL. Memory cells in a first row may be commonly connected to a first word-line WL(1). The memory cells MC1 may be controlled by a voltage on the word-lines WL(1), . . . , WL(n).

In the NOR flash memory device including memory cell array 100a, a read operation and a program operation may be performed per byte or word, and an erase operation may be performed per block 120a. In the program operation, a bulk voltage having a range of about −0.1 to −0.7 volts may be applied to a bulk substrate of the NOR flash memory device.

Referring to FIG. 4, the memory cell array 100b may include string select transistors SST, ground select transistors GST and a plurality of memory cells MC2. The string select transistors SST may be connected to bit-lines BL(1), . . . , BL(m), and the ground select transistors GST may be connected to a common source line CSL. The memory cells MC2 may be connected in series between the string select transistors SST and the ground select transistors GST. Memory cells in the same row may be connected to the same word-line among a plurality of word-lines WL(1), . . . , WL(n). For example, 16, 32 or 64 word-lines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the word-lines WL(1), . . . , WL(n).

In the NAND flash memory device including memory cell array 100b, a read operation and a program operation may be performed per page 110b, and an erase operation may be performed per block 120b. During the program operation, a bulk voltage having a level of about 0 volts may be applied to a bulk substrate of the NAND flash memory device. According to embodiments, each page buffer 310 of FIG. 2 may be connected to an odd-numbered bit-line and an even-numbered bit-line. In this case, the odd-numbered bit-lines may form odd-numbered pages, the even-numbered bit-lines may form even-numbered pages, and program operations for the odd-numbered pages and the even-numbered pages may be alternately performed.

Referring to FIG. 5, a memory cell array 100c may include a plurality of strings 130c each of which has a vertical structure. Each string may include string select transistors SSTV, ground select transistors GSTV, and a plurality of memory cells MC3 that are formed in a first direction D1 and are connected in series between the string select transistors SSTV and the ground select transistors GSTV. The plurality of strings 130c may be formed in a second direction D2 to define a string column, and a plurality of string columns may be formed in a third direction D3 to define a string array.

The string select transistors SSTV may be connected to bit-lines BL(1), . . . , BL(m), and the ground select transistors GST may be connected to a common source line CSL. Furthermore, the string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same word-line among word-lines WL(1), WL(2), . . . WL(n−1), WL(n). Each string select line and each ground select line may extend in the second direction D2, and the string select lines SSL11, . . . , SSLi1 and the ground select lines GSL11, . . . , GSLi1 may be arranged or stacked in the third direction D3. Each word-line may extend in the second direction D2 and the third direction D3, and the word-lines WL(1), . . . , WL(n) may be arranged or stacked in the first direction D1. Each bit-line may extend in the third direction D3, and the bit-lines BL(1), . . . , BL(m) may be arranged or stacked in the second direction D2. The memory cells MC3 may be controlled by a voltage on the word-lines WL(1), . . . , WL(n).

Similarly to the NAND flash memory device, in the vertical flash memory device including memory cell array 100c, a read operation and a program operation may be performed per page, and an erase operation may be performed per block.

Although not illustrated in FIG. 5, according to some embodiments, two string select transistors included in a single string may be connected to a single string select line, and two ground select transistors included in the single string may be connected to a single ground select line. According to some embodiments, the single string may include one string select transistor and one ground select transistor.

Referring to FIGS. 6, 7 and 8, the vertical flash memory device may include a ground select line 256, a word-line 252 and a string select line 254 that are spaced apart from each other along a first direction D1 substantially perpendicular to a top surface of a substrate 101, and a channel 142 extending from substrate 101 in the first direction D1 on sidewalls of ground select line 256, word-line 252 and string select line 254. The vertical flash memory device may further include a bit-line 290 electrically connected to channel 142, and a common source line 105. Bit-line 290 may be electrically connected to channel 142 via a pad 162 and a bit-line contact 280.

Channel 142 may include polysilicon or doped polysilicon. For example, channel 142 may include polysilicon doped with p-type impurities, e.g., polysilicon doped with indium or gallium. Channel 142 may further include carbon and/or germanium. A plurality of channels 142 may be formed in a second direction D2 substantially parallel to the top surface of substrate 101 to define a channel column, and a plurality of channel columns may be formed in a third direction D3 substantially perpendicular to the second direction D2 to define a channel array.

Channel 142 may be cup shaped and/or of a hollow cylindrical shape. A filling layer pattern 150 may be formed in a space defined by an inner sidewall of the cup shaped, for example, 142. Filling layer pattern 150 may include, for example, an insulating material (e.g., an oxide).

Pad 162 may be on filling layer pattern 150 and channel 142, and may electrically connect channel 142 to bit-line contact 280. Pad 162 may serve as a source/drain region by which charges may be moved through channel 142. Pad 162 may include doped polysilicon. For example, pad 162 may include polysilicon doped with impurities, e.g., phosphorous, arsenic, etc. When pad 162 includes polysilicon doped with phosphorous, pad 162 may further include carbon.

Each of ground select line 256, word-line 252 and string select line 254 may be at a single level (e.g., one of each, each at a different height) or more than one level, and a first insulation layer pattern 115 may be interposed therebetween. In FIG. 6, ground select line 256 and string select line 254 may be at 2 levels (e.g., two of each at different heights), respectively, and word-line 252 may be at 4 levels between ground select line 256 and string select line 254. However, ground select line 256 and string select line 254 may be at one level, and word-line 252 may be formed at 2, 8, 16 or another convenient number of levels. According to embodiments, each of ground select line 256, word-line 252 and string select line 254 may extend in the second direction D2, and a plurality of ground select lines 256, a plurality of word-lines 252, and a plurality of string select lines 254 may be arranged in the third direction D3. First insulation layer pattern 115 may include, for example, a silicon oxide (e.g., silicon dioxide (SiO2), silicon oxycarbide (SiOC) and/or silicon oxyfluoride (SiOF)).

A tunnel insulation layer pattern 220, a charge trapping layer pattern 230 and a blocking layer pattern 240 may be disposed between each of ground select line 256, word-line 252 and string select line 254, and an outer sidewall of channel 142 in a direction substantially perpendicular to the outer sidewall of channel 142. Tunnel insulation layer pattern 220, charge trapping layer pattern 230 and blocking layer pattern 240 may be disposed between each of ground select line 256, word-line 252 and string select line 254, and first insulation layer pattern 115 and/or on a sidewall of first insulation layer pattern 115. According to certain embodiments of the inventive concept, tunnel insulation layer pattern 220 may be disposed only on the outer sidewall of channel 142.

Ground select line 256, word-line 252 and string select line 254 may include, for example, a metal and/or a metal nitride. For example, ground select line 256, word-line 252 and string select line 254 may include a metal and/or a metal nitride with low electrical resistance (e.g., tungsten, tungsten nitride, titanium, titanium nitride, tantalum, tantalum nitride and/or platinum). According to at least one example embodiment, each of ground select line 256, word-line 252 and string select line 254 may be a multi-layered structure including a barrier layer, for example, a metal nitride and/or a metal layer including a metal.

Tunnel insulation layer pattern 220 may include a silicon oxide, and charge trapping layer pattern 230 may include a nitride (e.g., a silicon nitride and/or a metal oxide). Blocking layer pattern 240 may include a silicon oxide and/or a metal oxide (e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide). Blocking layer pattern 240 may be a multi-layered structure of a silicon oxide layer and a metal oxide layer.

A second insulation layer pattern 260 may be disposed between structures each of which may include ground select line 256, word-line 252 and string select line 254 extending in the second direction and first insulation layer pattern 115 disposed therebetween. Second insulation layer pattern 260 may include an insulating material (e.g., an oxide). An impurity region may be disposed at an upper portion of substrate 100 beneath second insulation layer pattern 260, which may extend in the second direction D2 and serve as common source line 105. The impurity region of common source line 105 may include n-type impurities, for example, phosphorus and/or arsenic.

Bit-line 290 may be electrically connected to pad 162 via bit-line contact 280, and may be electrically connected to channel 142. Bit-line 290 may include, for example, a metal, a metal nitride and/or doped polysilicon. Bit-line 290 may extend in the third direction. Bit-line contact 280 may be contained in a third insulation layer 270, and contact pad 162. Bit-line contact 280 may include, for example, a metal, a metal nitride and/or doped polysilicon. Metal lines 291 may be electrically connected to ground select line 256, word-line 252 and string select line 254 through contact plugs 281, and thus electrical signals applied to metal lines 291 may be provided to ground select line 256, word-line 252 and string select line 254.

Third insulation layer 270 may be disposed on first and second insulation layer patterns 115 and 260, channel 142, pad 162, blocking layer pattern 240, charge trapping layer pattern 230 and tunnel insulation layer pattern 220. Third insulation layer 270 may include an insulating material, for example, an oxide.

Figure 9:
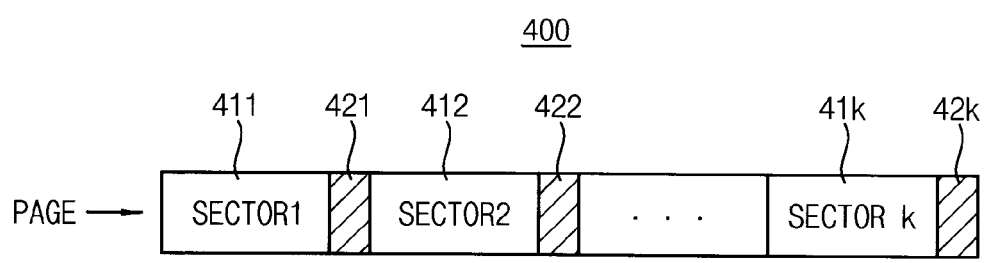
FIG. 9 is a diagram illustrating a configuration of one page included in a memory cell array shown in FIG. 2A.

FIG. 9 is a diagram illustrating a configuration of one page 400 included in a memory cell array shown in FIG. 2A.

Referring to FIG. 9, page 400, among a plurality of pages included in memory cell array 100, includes a plurality of sectors 411 to 41$k$. Each of sectors 411 to 41$k$ stores sector data and is a basic unit for data input/output in non-volatile memory device 60. ECC parity values 421 to 42$k$, each comprising one or more parity bits and serving as an error detection and error correction code, are generated based on data, that is, sector data stored in sectors 411 to 41$k$, respectively. ECC parity values 421 to 42$k$ are generated for each set of data to be stored in sectors 411 to 41$k$, respectively. In this case, respective sizes of sectors 411 to 41$k$ suitable for correcting an error may vary according to ECC block 55.

Figure 10:
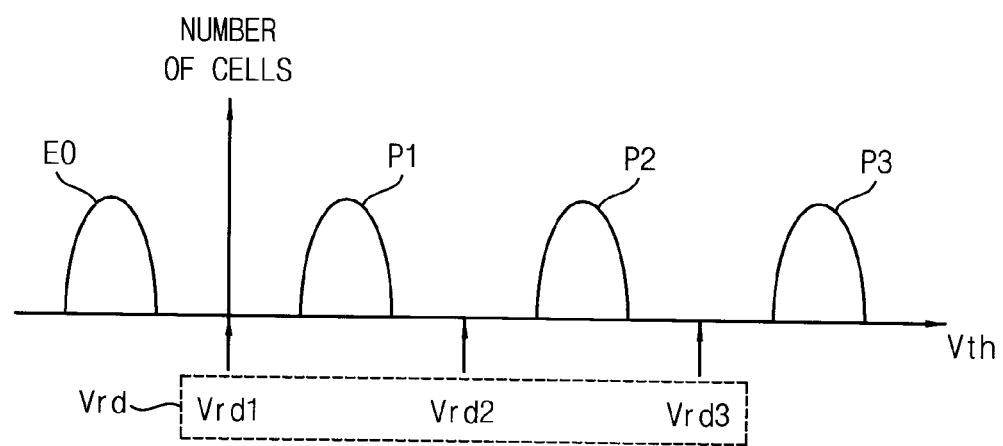
FIG. 10 illustrates a threshold voltage distribution which may be formed on each memory cell of a memory cell array shown in FIG. 2A.

FIG. 10 illustrates a threshold voltage distribution which may be formed on each memory cell of a memory cell array shown in FIG. 2A.

Figure 11:
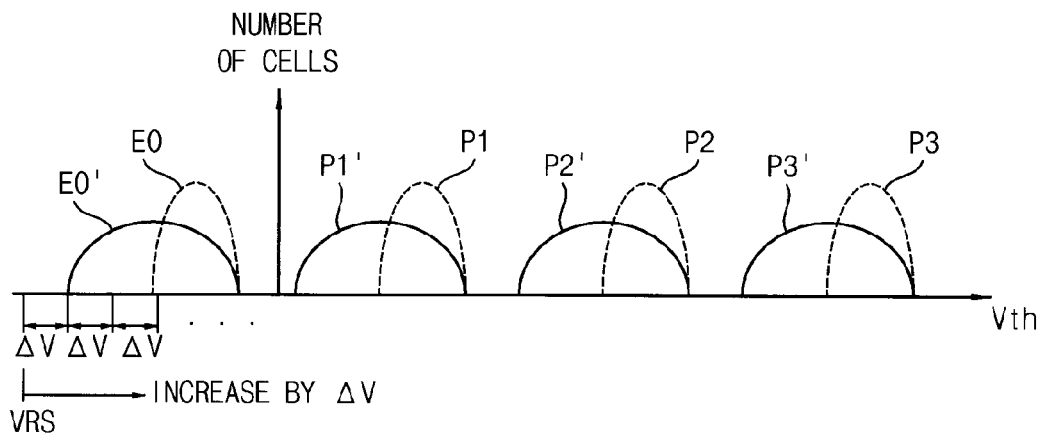
FIGS. 11 and 12 illustrates modified examples of the threshold voltage shown in FIG. 10.
Figure 12:
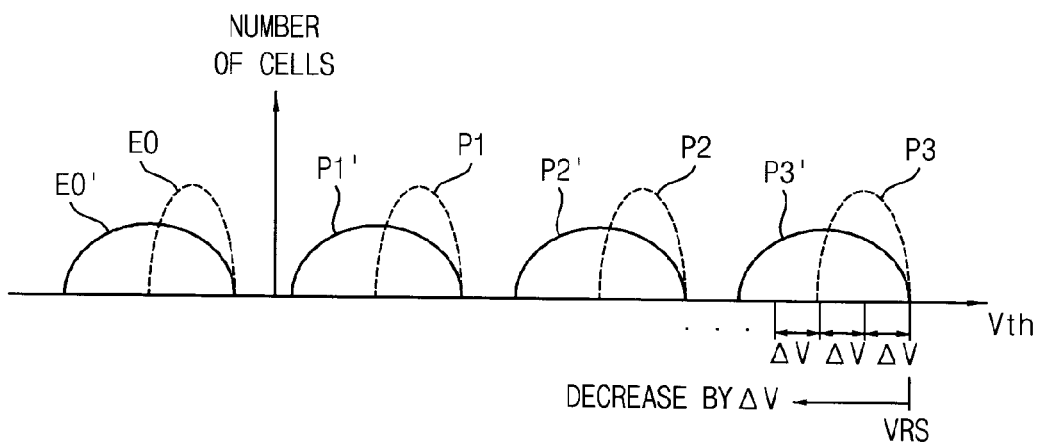

FIGS. 11 and 12 illustrate modified examples of the threshold voltage shown in FIG. 10.

Referring to FIG. 10, when memory cell array 100 of non-volatile memory device 60 shown in FIG. 2A is implemented by an MLC where data of 2 bits per cell are programmed, each of the memory cells may be programmed in one of four data states E0, P, P2, and P3. The data states E0, P, P2, and P3 may be sensed by applying a plurality of selection read voltages Vrd1, Vrd2, and Vrd3, respectively. However, the threshold voltage distribution shown in FIG. 10 may unintentionally vary due to various factors.

For example, a charge retention characteristic of a flash memory cell may be degraded due to thermionic emission according to a defect of an inter-poly insulation layer, charge diffusion, ion impurities, program disturbance, and hot temperature stress (HTS). In addition, the threshold voltage distribution of the flash memory cell may be changed due to factors such as a soft program and an over program. As a result of these things, the threshold voltage distribution of the flash memory cell may be changed from states "E0, P1, P2, P3" to states "E0', P1', P2', P3'" as shown in FIGS. 11 and 12. The variation in the threshold voltage distribution of the flash memory cell may reduce a read margin and cause a read error.

In order to compensate for the read error, memory controller 20 may perform an ECC error correction operation to correct an error of the read sector data in response to the read sector data and the ECC parity bit(s) from non-volatile memory device 60. Further, when the number of errors occurring during the read operation exceeds a correctable range in the ECC error correction operation, memory controller 20 may control non-volatile memory device 60 to perform a read retry operation.

Referring to FIG. 11, the read operation may be repeatedly performed during the read retry operation until correct data are read while increasing a voltage from a predetermined start voltage VRS by a predetermined voltage increment ΔV. In another example embodiment, a read operation may be repeated during the read retry operation until exact data are read while reducing the voltage from the predetermined start voltage VRS by the predetermined voltage increment ΔV as shown in FIG. 12. In example embodiments, a series of operations for sensing exact read data may be defined as one read retry operation for the purpose of convenience of explanation. For example, a plurality of read operations may be performed in the one read retry operation by applying a plurality of variable selection read voltages until correct data are read. The data read to have a correct value through the read retry operation may be provided to the host through memory controller 20.

Figure 13:
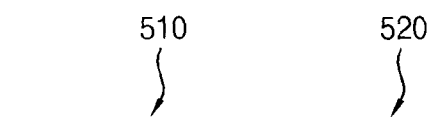
FIG. 13 illustrates an example of a configuration of a sector table shown in FIG. 2B according to example embodiments.

FIG. 13 illustrates an example of a configuration of a sector table 500 which may be an example embodiment of sector table 35 shown in FIG. 2B.

Referring to FIG. 13, sector table 500 includes, as an entry, a sector number SECTOR NO 510 indicating sectors 411 to 41k, respectively, and a flag signal FLAG 520 indicating whether the ECC decoding for data of respective sectors 411 to 41k succeeds. As one example, a case where a page of FIG. 9 is configured with 8K of data cells and eight sectors SECTOR1 to SECTOR8 will be described with respect to FIG. 13. Accordingly, the eight sectors SECTOR1 to SECTOR8 may be expressed as "000, 001, 010, 011, 100, 101, 110, 111", respectively. Further, FIG. 13 illustrates a case where a flag signal FLAG 520 of the third sector SECTOR3 is at a low level "0" because sector data of the third sector SECTOR3 include an uncorrectable error as a result of the ECC decoding for each sector. Accordingly, the third sector SECTOR3 is selected as the target sector and remaining sectors are selected as pass sectors.

Figure 14:
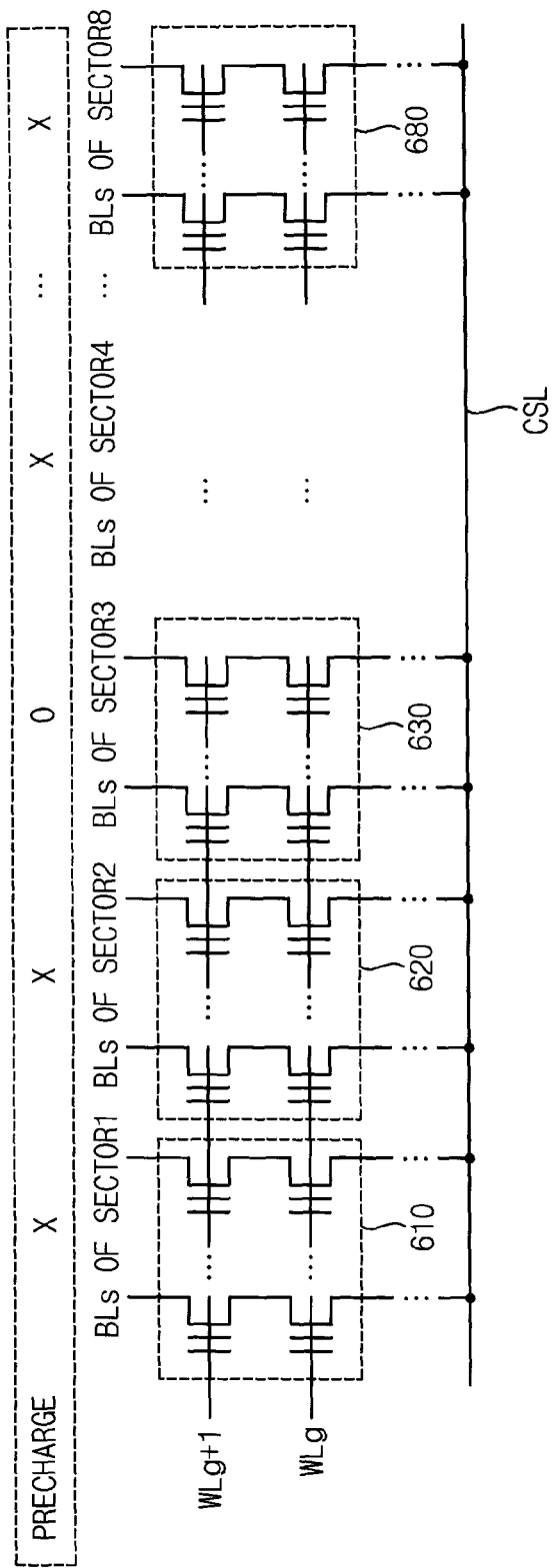
FIG. 14 illustrates target bit lines connected to a target sector and selectively precharged for the case illustrated in FIG. 13.

FIG. 14 illustrates target bit lines connected to a target sector and selectively precharged for the case illustrated in FIG. 13.

Referring to FIGS. 13 and 14, when the data of the third sector SECTOR3 include an uncorrectable error as the ECC decoding result, the example embodiments may inhibit precharge of bit-lines connected to the pass sector while precharging only bit lines connected to the third sector SECTOR3, and may perform a read retry operation for data of the third sector SECTOR3. That is, if the ECC decoding result for sectors 610 to 680 indicates that the data of third sector 630 includes an uncorrectable error as shown in FIG. 13, a selection read voltage Vrd is applied to a selected word line WLg after only the bit lines connected to third sector 630 have been selectively precharged, and then a non-selection read voltage Vread is applied to a non-selected word line WLg+1. Accordingly, memory cells may be turned on/off according to data programmed in the memory cells connected to the selected word line WLg and included in third sector 630. In this case, a current flows through channels of the memory cells which are turned-on. Accordingly, the current is applied to a common source line CSL.

Figure 15A:
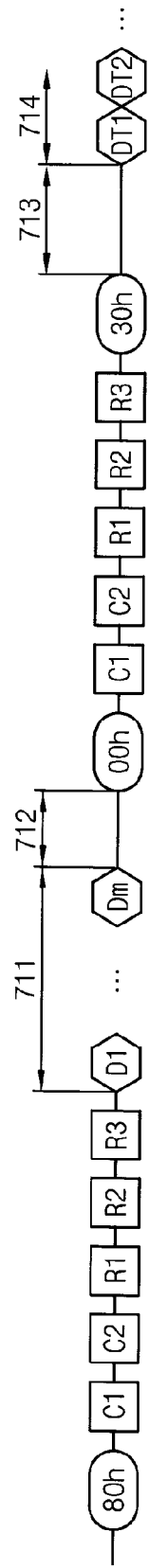
FIG. 15A is a timing chart illustrating a procedure of setting a target sector in the memory system shown in FIG. 2A according to example embodiments.

FIG. 15A is a timing chart illustrating a procedure of setting a target sector in the memory system shown in FIG. 2A according to example embodiments.

Referring to FIGS. 2A and 15A, after a serial data input command 80h is input to non-volatile memory device 60, an address C1C2R1R2R3 for a page including the target sector, and data (D1 to Dm) 711 for setting the target sector, are transferred to non-volatile memory device 60 from memory controller 20 in the preset timing. Data 711 for setting the target sector are loaded into page buffer 310 through input/output buffer 330 and column selection circuit 320. Data 711 for setting the target sector includes a data pattern of the target sector and a data pattern of a non-target sector, and the data pattern of the target sector differs from the data pattern of a non-target sector. That is, the data pattern of third sector 630 serving as the target sector in FIG. 14 differs from data patterns of other sectors 610, 620, 640 to 680. If data 711 for setting the target sector are loaded into page buffer unit 320, page buffer unit 320 precharges only target bit lines connected to target sector (712).

Next, if a read operation starts, a '00h' command, an address C1C2R1R2R3 for a page including the target sector, and a '30h' command are sequentially transferred to non-volatile memory device 60 in the preset timing. If the '30h' command is input to non-volatile memory device 60, page buffer unit 310 senses and latches sector data of the target sector from memory cell array 100 under control of control logic 350 (713). If the sensing and latching of the sector data of the target sector are completed, data DT1, DT2 . . . stored in page buffer unit 310 are provided to data buffer 50 of memory controller 50 through column selection circuit 320 and input/output buffer 330 (714). Data buffer 50 transfers re-read data to ECC block 55, and ECC block 55 may perform ECC decoding for re-read sector data of the target sector, and provide the decoded sector data to control block 30. The above read retry operations may be repeated until all errors in the sector data of the target sector are corrected.

FIGS. 15B and 15C illustrate example input data patterns for setting the target sector according to example embodiments.

Referring to FIG. 15B, all data patterns input to third sector 630 serving as the target sector are "0" and all data patterns input to other sectors 610, 620, 640 to 680 are "1".

Referring to FIG. 15C, all data patterns input to third sector 630 serving as the target sector are "1" and all data patterns input to other sectors 610, 620, 640 to 680 are "0".

Figure 16:
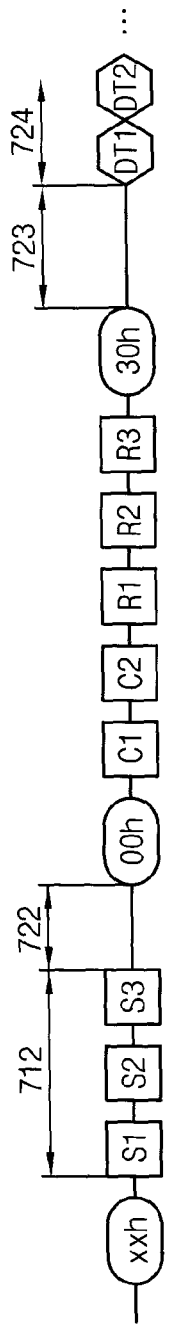
FIG. 16 is a timing chart illustrating a procedure of setting a target sector in the memory system shown in FIG. 2A according to other example embodiments.

FIG. 16 is a timing chart illustrating a procedure of setting a target sector in the memory system shown in FIG. 2A according to other example embodiments.

Referring to FIGS. 2A and 16, after a target sector selection command XXh is input to non-volatile memory device 60, a sector address (S1S2S3) 712 for selecting the target sector is provided to non-volatile memory device 60 from memory controller 20 in the preset timing. If sector address (S1S2S3) 712 for selecting the target sector is input to non-volatile memory device 60, page buffer unit 320 precharges only target bit lines connected to the target sector based on the sector address (S1S2S3) 712 (722).

Next, if a read operation starts, a '00h' command, an address C1C2R1R2R3 for a page including the target sector, and a '30h' command are sequentially transferred to non-volatile memory device 60 in the preset timing. If the '30h' command is input to non-volatile memory device 60, page buffer unit 310 senses and latches sector data of the target sector from memory cell array 100 under control of control logic 350 (723). If the sensing and latching of the sector data of the target sector are completed, data DT1, DT2 , , , stored in page buffer unit 310 are provided to data buffer 50 of memory controller 50 through column selection circuit 320 and input/output buffer 330 (724). Data buffer 50 transfers re-read data to ECC block 55, and ECC block 55 may perform ECC decoding for sector data of the re-read target sector, and provide the decoded sector data to control block 30. The above read retry operations may be repeated until all errors in the sector data of the target sector are corrected.

Figure 17:
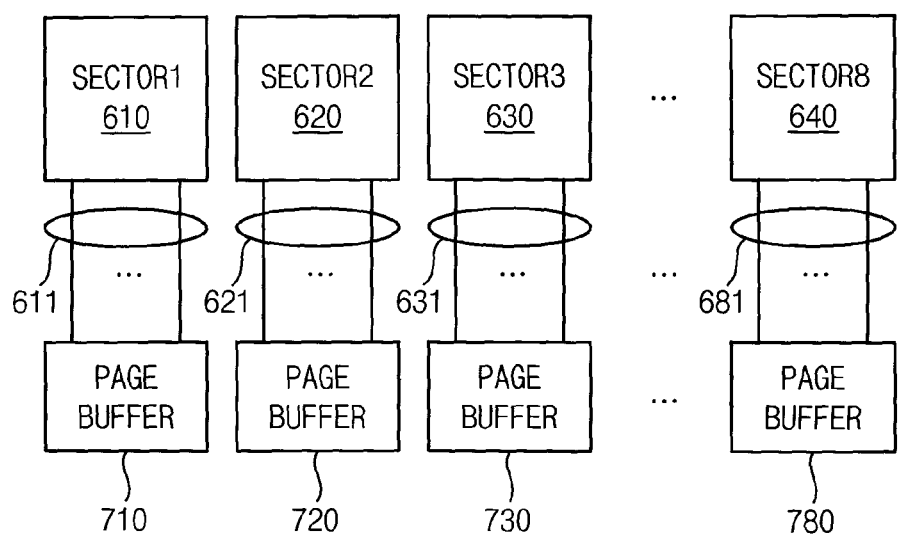
FIG. 17 is a view illustrating a connection relationship between sectors and page buffers according to example embodiments.

FIG. 17 illustrates a connection relationship between sectors and page buffers according to example embodiments.

Referring to FIG. 17, a plurality of sectors 610 to 680 may be connected to corresponding page buffers 710 to 780 through bit lines 611 to 681, respectively. If the sector data of third sector 630 includes an uncorrectable error, as described with reference to FIG. 15B, a data pattern "0" is input to page buffers 730 and a data pattern "1" is input to other page buffers 710, 720, and 740 to 780. Accordingly, only page buffer 730 may perform the read retry operation by precharging bit lines 631. Further, if the sector data of third sector 630 includes an uncorrectable error, as described with reference to FIG. 16, a sector address S1S2S3 of "011" is input to select third sector 630 and page buffers 730 may perform the read retry operation by precharging bit lines 631 connected to third sector 630.

Figure 18:
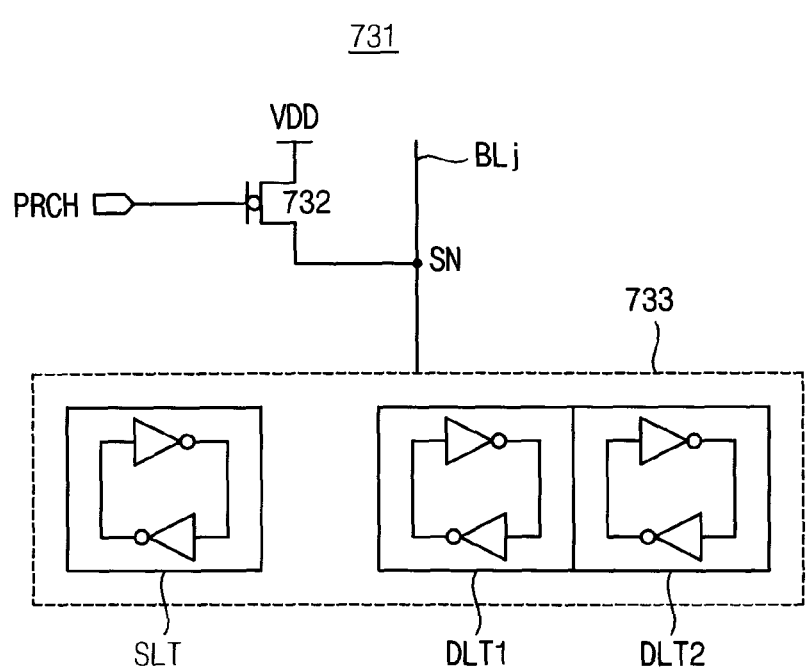
FIG. 18 is a block diagram illustrating a configuration of one page buffer included in page buffers shown in FIG. 17 according to example embodiments.

FIG. 18 is a block diagram illustrating a configuration of one page buffer included in page buffers shown in FIG. 17 according to example embodiments.

Referring to FIG. 18, one page buffer 731 may include a P-type Metal-Oxide Semiconductor (PMOS) transistor 732 and a latch unit 733. PMOS transistor 732 precharges a corresponding bit line BLj with a power supply voltage VDD level in response to a precharge control signal. Latch unit 733 may include a plurality of latches SLT, DLT1, and DLT2. The sensing latch SLT senses and stores a voltage variation of a sensing node SN connected to the bit line BLj during a sensing operation. The data latches DLT1 and DLT2 are used for a program operation. The data latch DLT1 is used to transfer program data to the bit line BLj, and the data latch DLT2 stores the program data received from memory controller 20. Page buffer 731 may further include a combinational circuit for determining activation of the precharge control signal PRCH according to data patterns stored in the data latches DLT1 and DLT2.

As illustrated with reference to FIG. 15B, if a specific data pattern is input to the data latches DLT1 and DLT2, the precharge control signal PRCH is activated with a low level so that the bit line BLj may be precharged. Further, as illustrated with reference to FIG. 16, a sector selection command XXh and the sector address S1S2S3 are input, the precharge control signal PRCH is activated with a low level so that the bit line BLj may be precharged.

Figure 19:
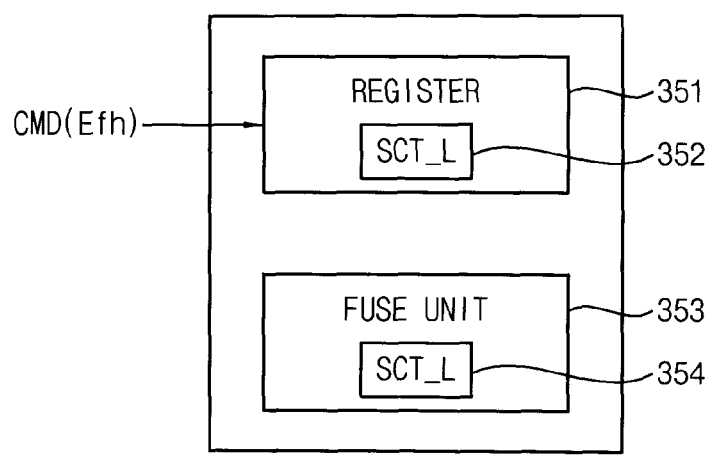
FIG. 19 is a block diagram illustrating a configuration of a control logic shown in FIG. 2A according to example embodiments.

FIG. 19 is a block diagram illustrating a configuration of a control logic shown in FIG. 2A according to example embodiments.

Referring to FIG. 19, control logic 350 may include a register 351 and/or a fuse unit 353.

Register 351 may store sector size information 352 received together with a set feature command Efh from memory controller 20 of FIG. 1, and set sizes of sectors included in one page according to the stored information. The sizes of the sectors included in one page 400 of FIG. 9 may be set based on sector data and parity bits stored in the respective sectors. Memory controller 200 may variously set the sizes of the sectors included in the one page using the set feature command Efh.

Further, fuse unit 353 may store sector size information 354. When fuse unit 353 stores sector size information 354, fuse unit 353 may set the sizes of the sectors included in one page 400 of FIG. 9 based on sector size information 354 during a power-up sequence of non-volatile memory device 60. In this case, sector size information 354 may be set through fuse option at a wafer level or a package level. In another example embodiment, sector size information SCT_L may be non-volatile trim information and may be stored in memory cell array 100. When the sector size information SCT_L is stored in memory cell array 100 as the non-volatile trim information, the sector size information SCT_L may be loaded into control logic 350 through page buffer unit 310 from memory cell array 100 during the power-up sequence under control of control logic 350.

Figure 20:
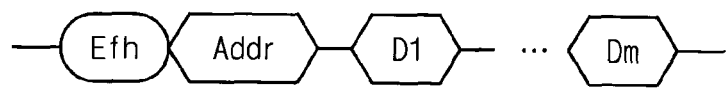
FIG. 20 is a timing chart illustrating a method of setting a sector size according to example embodiments.

FIG. 20 is a timing chart for illustrating a method of setting a sector size according to example embodiments.

Referring to FIGS. 2A, 19, and 20, in order to set the sector size, the set feature command Efh, the address Addr, and the data D1 to Dm are transmitted to non-volatile memory device 60 from memory controller 20 in the preset timing. The address Addr may be used to indicate a location of register 351 in which data D1 to Dm indicating sector size information 352 will be stored. The operation of setting the size of the sector may be achieved by transmitting the sector size SCT_L to non-volatile memory device 60 from memory controller 200 together with the set feature command Efh after power-up. In the example embodiments, only a part of the data D1 to Dm provided together with the set feature command Efh may be used as data indicating the sector size SCT_L. Remaining data may be used to designate other parameters.

Figure 21:
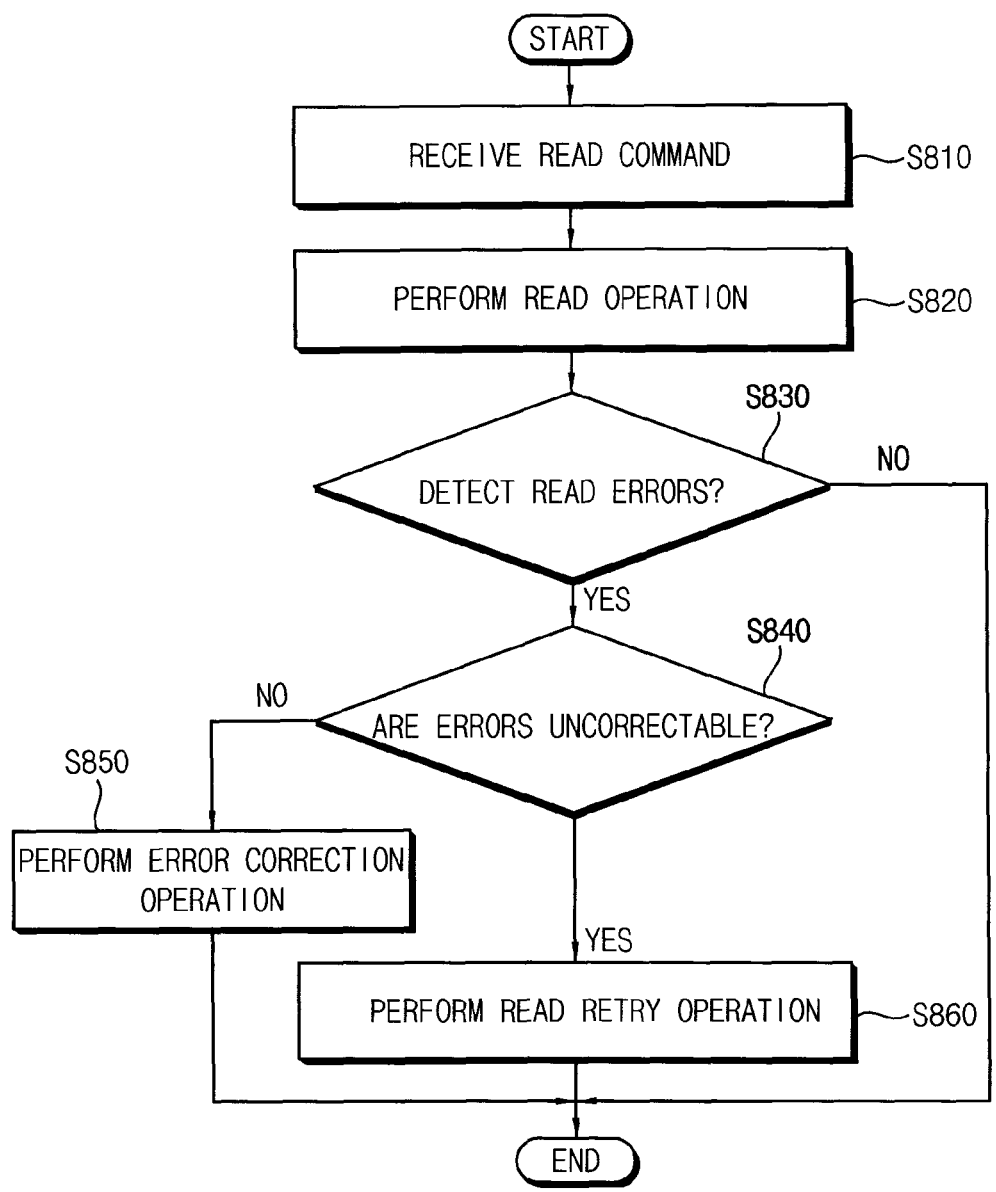
FIG. 21 is a flowchart illustrating a method of operating the memory system according to example embodiments.

FIG. 21 is a flowchart illustrating a method of operating the memory system according to example embodiments.

Referring to FIGS. 2A, 2B, and 21, in the method of operating a memory system according to the example embodiments, non-volatile memory device 60 receives a read command from memory controller 20 (S810). Non-volatile memory device 60 having received the read command performs a read operation for data in a unit of page (i.e., on a page-by-page basis) (S820), and transmits the read data to memory controller 20. Here, the page includes a plurality of sectors. In this case, as illustrated with reference to FIG. 9, parity values including one or more parity bits are transmitted by memory device 60 to memory controller 20 together with the sector data for each sector of the page. ECC block 55 of memory controller 20 performs ECC decoding for the read data of the page in units of sectors (i.e., on a sector-by-sector basis) using the parity value for the sector to determine whether any read error is sensed from any of the sectors (S830). If a read error is not sensed in step S830, the read data are transmitted to the host through host buffer 57. If a read error is sensed in step S830 (YES), ECC block 55 of memory controller 20 determines for each sector whether errors sensed for that sector are uncorrectable (S840). If the errors of all of the sectors of the page are determined in step S840 to be correctable (NO), then ECC block 55 of memory controller 20 corrects the errors of each sector (S850) and transmits error-corrected data to the host through host buffer 57. If the read data is determined in step S840 to include at least one sector with at least one uncorrectable error, memory controller 200 controls non-volatile memory device 60 to perform the read retry operation for the sector(s) with the uncorrectable error (S860).

Figure 22:
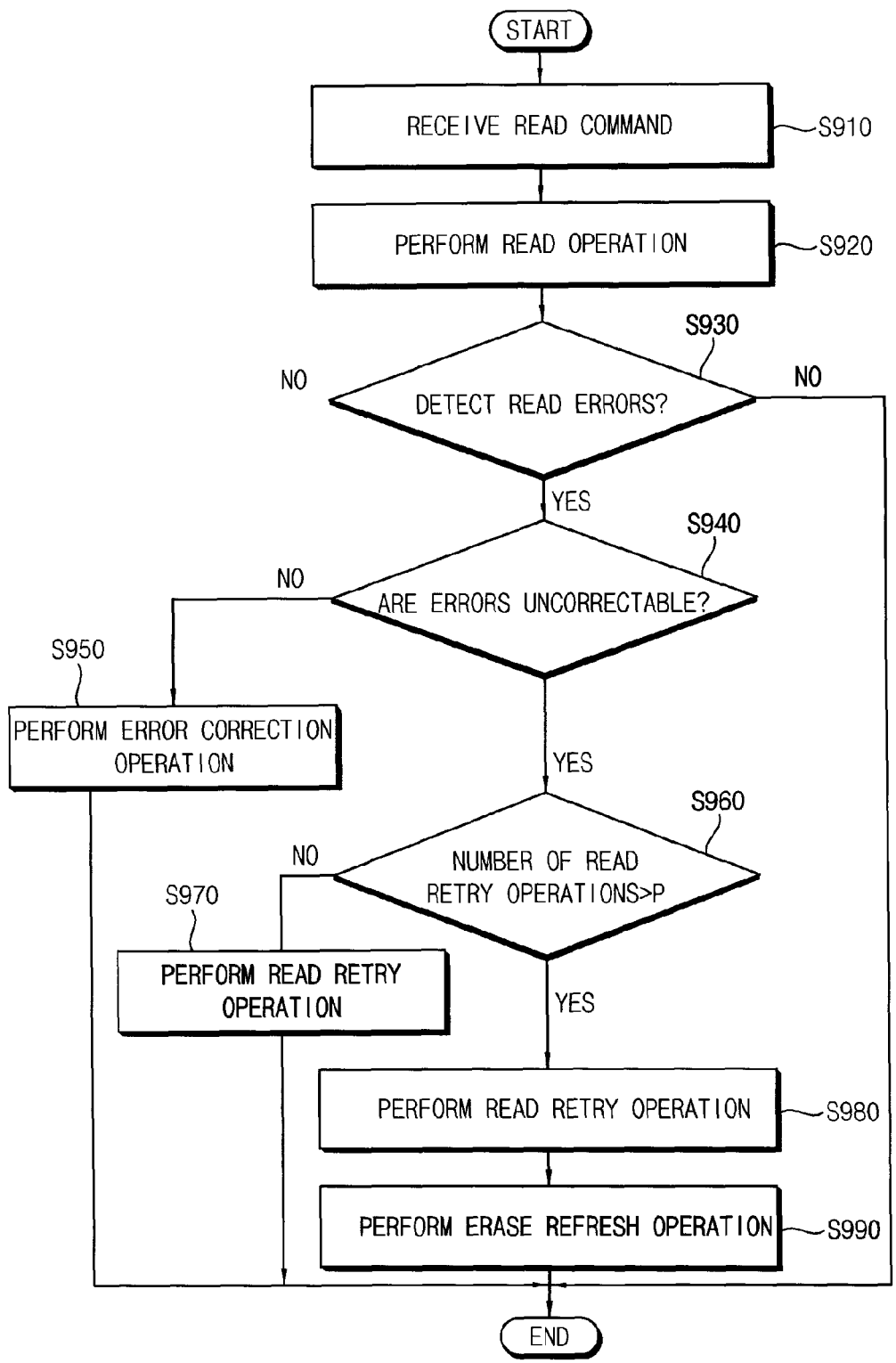
FIG. 22 is a flowchart illustrating a method of operating the memory system according to example embodiments.

FIG. 22 is a flowchart illustrating a method of operating the memory system according to example embodiments.

Referring to FIGS. 2A, 2B, and 22, in the method of operating a memory system according to the example embodiments, non-volatile memory device 60 receives a read command from memory controller 20 (S910). Non-volatile memory device 60 having received the read command performs a read operation for data in a unit of a page (S920), and transmits read data to memory controller 20. Here, the page includes a plurality of sectors. In this case, as illustrated with reference to FIG. 9, parity values including one or more parity bits are transmitted by memory device 60 to memory controller 20 together with the sector data. ECC block 55 of memory controller 20 performs ECC decoding for the read data of the page in units of sectors (i.e., on a sector-by-sector basis) to determine whether any read error is sensed from any of the sectors (S930). If a read error is not sensed in step S930, the read data are transmitted to the host through host buffer 57. If a read error is sensed in step S930 (YES), it is determined for each sector whether errors sensed are uncorrectable (S940). If it is determined in step S940 that the errors of all of the sectors are correctable, then ECC block 55 of memory controller 20 corrects the errors of the sectors (S950) and transmits error-corrected data to the host through host buffer 57. If the read data is determined in step S940 to include at least one sector (target sector) with at least one uncorrectable error (YES), then it is determined whether a read retry operation for the target sector is performed more than the preset reference number of times, P (S960). If it is determined in step S960 that the read retry operation for the target sector is performed less than the preset reference number of times P, then the read retry operation is performed (S970). When it is determined in step S960 that the read retry operation for the target sector is performed more than the preset reference times P, then the read retry operation for the target sector is performed (S980). After performing the read retry operation for the target sector, ECC block 55 of memory controller 20 performs an erase refresh operation which copies a memory block which includes the target sector to another block and erases the memory block which includes the target sector (S990).

Figure 23:
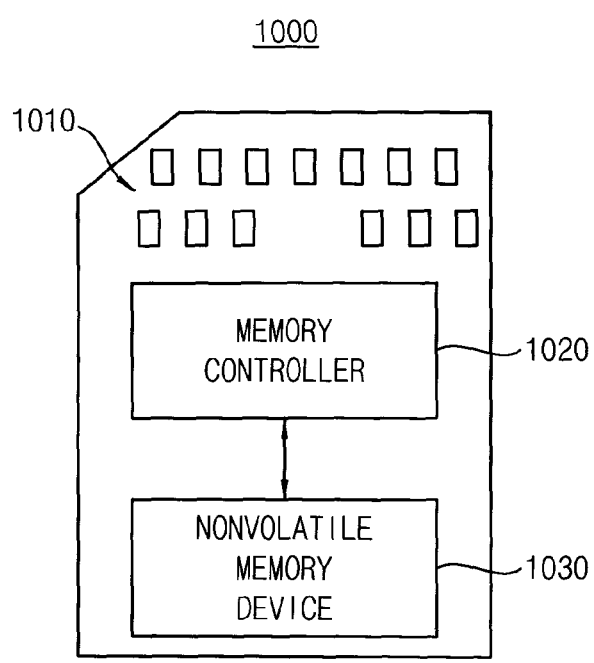
FIG. 23 is a block diagram illustrating a memory card that may incorporate a memory system according to example embodiments.

FIG. 23 is a block diagram illustrating a memory card that may incorporate a memory system according to example embodiments.

Referring to FIG. 23, a memory card 1000 may include a plurality of connecting pins 1010, a memory controller 1020 and a nonvolatile memory device 1030.

Connecting pins 1010 may be coupled to a host (not illustrated) to transfer signals between the host and memory card 1000. Connecting pins 1010 may include a clock pin, a command pin, a data pin and/or a reset pin.

Memory controller 1020 may receive data from the host (e.g., via connecting pins 1010), and may store the received data in nonvolatile memory device 1030.

Nonvolatile memory device 1030 may include memory cells, and memory controller 1020 may perform a read operation on the memory cell array in a unit of a page, perform error detection and correction on the read data in a unit of a sector, inhibit precharge of bit-lines connected to at least one pass sector including correctable errors while precharging target bit lines connected to at least one target sector including uncorrectable errors, and perform a read retry operation for data in the at least one target sector, thereby consuming less power than if all of the sectors of the read page were precharged for the read retry operation.

For example, memory card 1000 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

Memory card 1000 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 24:
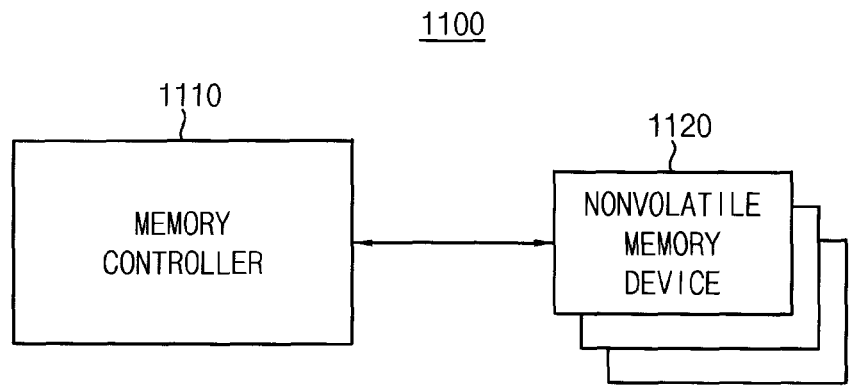
FIG. 24 illustrates a solid state drive (SSD) which includes a memory controller and a plurality of nonvolatile memory devices 0.

FIG. 24 is a diagram illustrating a solid state drive that may incorporate a memory system according to example embodiments.

Referring to FIG. 24, a solid state drive (SSD) 1100 may include a memory controller 1110 and a plurality of nonvolatile memory devices 1120.

Memory controller 1110 may receive data from a host (not illustrated). Memory controller 1110 may store the received data in the plurality of nonvolatile memory devices 1120.

Each of nonvolatile memory devices 1120 may include memory cells, and memory controller 1110 may perform read operation on the memory cell array in a unit of a page, perform error detection and correction on the read data in a unit of a sector, inhibit precharge of bit-lines connected to at least one pass sector including correctable errors while precharging target bit lines connected to at least one target sector including uncorrectable errors, and perform a read retry operation for data in the at least one sector, thereby reducing power consumption.

In some embodiments, solid state drive 1100 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 25:
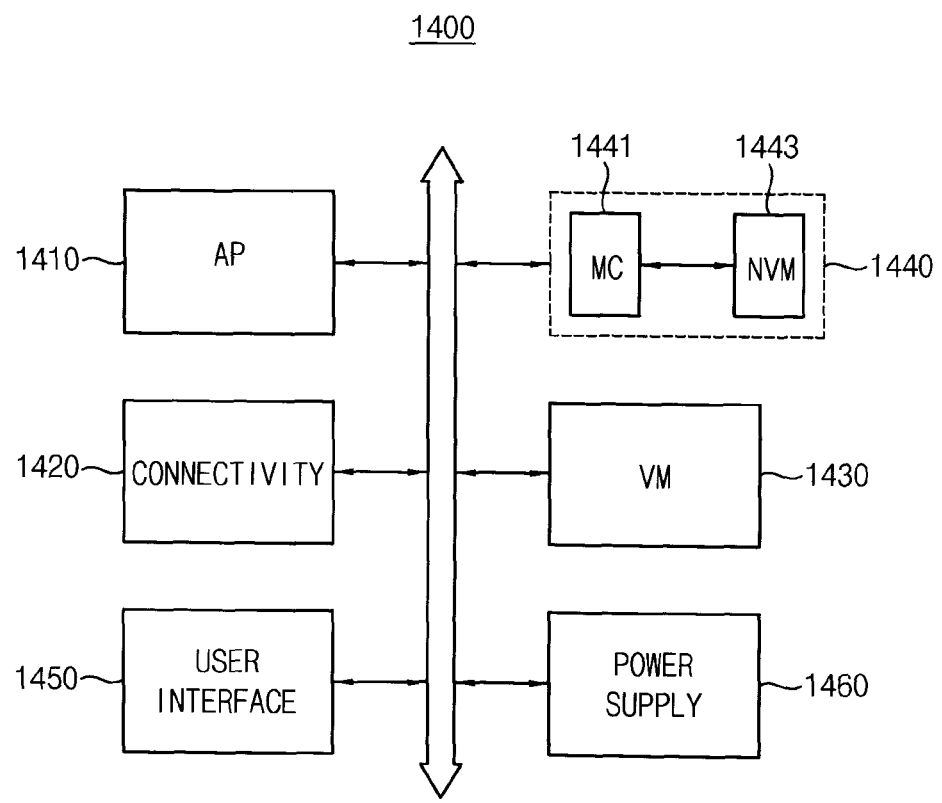
FIG. 25 is a diagram illustrating a mobile system that may incorporate a memory system according to example embodiments.

FIG. 25 is a diagram illustrating a mobile system that may incorporate a memory system according to example embodiments.

Referring to FIG. 25, a mobile system 1400 may include an application processor 1410, a connectivity unit 1420, a volatile memory device 1430, a nonvolatile memory system 1440, a user interface 1450 and a power supply 1460. Mobile system 1400 may be any mobile system, such as a mobile phone, a smart phone, a tablet computer, a laptop computer, a PDA, a PMP, a digital camera, a portable game console, a music player, a camcorder, a video player, a navigation system, etc.

Application processor 1410 may execute applications, such as an internet browser, a game application, a video player application, etc. Application processor 1410 may include a single processor core or a plurality of processor cores. For example, application processor 1410 may be a multi-core processor, such as a dual-core processor, a quad-core processor, a hexa-core processor, etc. Application processor 1410 may further include a cache memory located inside or outside application processor 1410.

Connectivity unit 1420 may perform wired or wireless communication with an external device. For example, connectivity unit 1420 may perform USB communication, Ethernet communication, near field communication (NFC), radio frequency identification (RFID) communication, mobile telecommunication, memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. Connectivity unit 1420 may include a baseband chipset.

Volatile memory device 1430 may store an instruction/data processed by application processor 1410, or may serve as a working memory. For example, volatile memory device 1430 may be implemented by a DRAM, a SRAM, a mobile DRAM, or the like.

Nonvolatile memory system 1440 may include a memory controller 1441 and a nonvolatile memory device 1443. Nonvolatile memory system 1440 may store a boot image for booting mobile system 1400. For example, nonvolatile memory system 1440 may be implemented by an electrically erasable programmable read-only memory (EEPROM), a flash memory, a PRAM, a RRAM, a MRAM, a FRAM, a nano floating gate memory (NFGM), a polymer random access memory (PoRAM), or the like. Nonvolatile memory system 1440 may include memory cells, and may perform read operation on the memory cell array in a unit of a page, perform error detection and correction on the read data in a unit of a sector, inhibit precharge of bit-lines connected to at least one pass sector including correctable errors while precharging target bit lines connected to at least one target sector including uncorrectable errors, and perform a read retry operation for data in the at least one target sector, thereby consuming less power than if all of the sectors of the read page were precharged for the read retry operation.

User interface 1450 may include at least one input device, such as a keypad, a touch screen, a microphone, etc., and at least one output device, such as a display device, a speaker, etc. Power supply 1460 may supply mobile system 1400 with power. Mobile system 1400 may further include a camera image processor (CIS), storage device, such as a memory card, a SDD, a CD-ROM, etc.

Mobile system 1400 and/or components of mobile system 1400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 26:
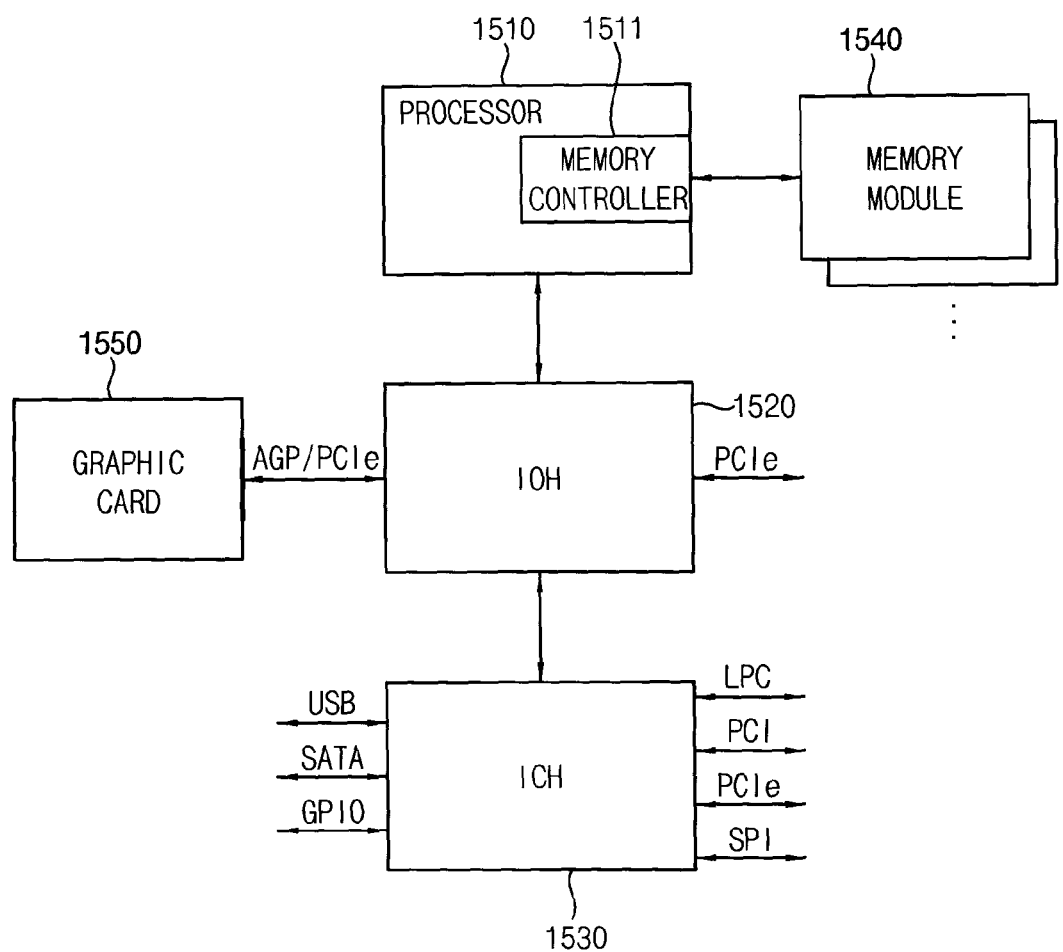
FIG. 26 is a diagram illustrating a computing system that may incorporate a memory system according to example embodiments.

FIG. 26 is a diagram illustrating a computing system that may incorporate a memory system according to example embodiments.

Referring to FIG. 26, a computing system 1500 may include a processor 1510, an I/O hub 1520, an I/O controller hub 1530, at least one memory module 1540 and a graphic card 1550. According to embodiments, computing system 1500 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

Processor 1510 may perform specific calculations or tasks. For example, processor 1510 may be a microprocessor, a central process unit (CPU), a digital signal processor, or the like. Processor 1510 may include a single processor core or a plurality of processor cores. Processor 1510 may be a multi-core processor, such as a dual-core processor, a quad-core processor, a hexa-core processor, etc. Although the example illustrated in FIG. 22 includes only one processor 1510, other embodiments may include a plurality of processors. In certain embodiments, processor 1510 may have an associated cache memory located inside or outside processor 1510.

Processor 1510 may include a memory controller (not illustrated) that controls an operation of memory module 1540. The memory controller included in processor 1510 may be referred to as an integrated memory controller (IMC). A memory interface between the memory controller and memory module 1540 may be implemented by one channel including a plurality of signal lines, or by a plurality of channels. Each channel may be coupled to at least one memory module 1540. The memory controller may be included in I/O hub 1520. I/O hub 1520 including the memory controller may be referred to as a memory controller hub (MCH).

Memory module 1540 may include a plurality of nonvolatile memory devices that store data provided from memory controller 1511. The nonvolatile memory devices may include memory cells, and may perform a read operation on the memory cell array in a unit of a page, perform error detection and correction on the read data in a unit of a sector, inhibit precharge of bit-lines connected to at least one pass sector including correctable errors while precharging target bit lines connected to at least one target sector including uncorrectable errors, and perform a read retry operation for data in the at least one target sector, thereby consuming less power than if all of the sectors of the read page were precharged for the read retry operation.

I/O hub 1520 may manage data transfer between processor 1510 and devices, such as graphic card 1550. I/O hub 1520 may be coupled to processor 1510 via at least one of various interfaces, such as a front side bus (FSB), a system bus, a HyperTransport, a lightning data transport (LDT), a QuickPath interconnect (QPI), a common system interface (CSI), etc. Although FIG. 26 illustrates an example of computing system 1500 including one I/O hub 1520, according to embodiments, computing system 1500 may include a plurality of I/O hubs.

I/O hub 1520 may provide various interfaces with the devices. For example, I/O hub 1520 may provide an accelerated graphics port (AGP) interface, a peripheral component interface-express (PCIe), a communications streaming architecture (CSA) interface, etc.

Graphic card 1550 may be coupled to I/O hub 1520 via the AGP or the PCIe. Graphic card 1550 may control a display device (not illustrated) for displaying an image. Graphic card 1550 may include an internal processor and an internal memory to process the image. In certain embodiments, input/output hub 1520 may include an internal graphic device along with or instead of graphic card 1550. The internal graphic device may be referred to as an integrated graphics, and an I/O hub including the memory controller and the internal graphic device may be referred to as a graphics and memory controller hub (GMCH).

I/O controller hub 1530 may perform data buffering and interface arbitration to efficiently operate various system interfaces. I/O controller hub 1530 may be coupled to I/O hub 1520 via an internal bus. For example, I/O controller hub 1530 may be coupled to I/O hub 1520 via at least one of various interfaces, such as a direct media interface (DMI), a hub interface, an enterprise Southbridge interface (ESI), PCIe, etc.

I/O controller hub 1530 may provide various interfaces with peripheral devices. For example, I/O controller hub 1530 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In certain embodiments, processor 1510, I/O hub 1520 and I/O controller hub 1530 may be implemented as separate chipsets or separate integrated circuits. In other embodiments, at least two of processor 1510, I/O hub 1520 and I/O controller hub 1530 may be implemented as one chipset.

The example embodiments are applicable to a non-volatile memory device and various apparatuses and systems using the same. Therefore, the example embodiments may be used in any device or system including a nonvolatile memory device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of embodiments and is not to be construed as limiting thereof. Although a few embodiments have been described, those skilled in the art will readily appreciate that many modifications are possible in the embodiments without materially departing from the scope of the inventive concept as set forth in the accompanying claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the claims.

What is claimed is:

1. A method of operating a memory system including a non-volatile memory device and a memory controller controlling the non-volatile memory device, the method comprising:
    reading data from a memory cell array in a unit of a page which includes a plurality of sectors;
    performing error correction decoding on the read data in a unit of a sector of the page;
    selecting at least one target sector which includes at least one uncorrectable error in the read data thereof, and selecting at least one pass sector wherein all errors of the read data of the pass sector are correctable by the error correction decoding;
    inhibiting precharging of bit-lines connected to the at least one pass sector while precharging target bit lines connected to the at least one target sector; and
    performing a read retry operation for data stored in the at least one target sector.

2. The method of claim 1, wherein each sector stores one or more parity bits generated based on the data stored in the sector, wherein a number of errors of the read data of the at least one target sector is greater than a number of the parity bits, and wherein a number of errors of the read data of the at least one pass sector is less than or equal to the number of the parity bits.

3. The method of claim 1, wherein the read retry operation for the read data stored in the at least one target sector is repeated until the uncorrectable errors are corrected by the error correction decoding.

4. The method of claim 1, wherein the read retry operation for the data of the at least one target sector is repeated a preset reference number of times.

5. The method of claim 4, further comprising performing an erase refresh operation to copy a memory block which includes the at least one target sector to another memory block when the read retry operation for the data stored in the at least one target sector is repeated more than the preset reference number of times and to erase the memory block which includes the at least one target sector.

6. The method of claim 1, wherein the at least one target sector is selected as the memory controller inputs a pattern of data, which is different from a pattern of data input into memory cells of other sectors of the page except for the target sector, into memory cells included in the target sector.

7. The method of claim 6, wherein data values of "0" are input into the memory cells included in the target sector and data values of "1" are input into the memory cells included in the other sectors.

8. The method of claim 1, wherein sizes of the sectors are set according to a set feature command by the memory controller, respectively.

9. The method of claim 8, wherein the sizes of the sectors are set using at least a part of data transmitted to the non-volatile memory device after the set feature command.

10. The method of claim 1, wherein sizes of the sectors are stored in a fuse unit included in the non-volatile memory device through a fuse option at a wafer level or a package level, and are set according to data stored in the fuse unit during a power-up sequence of the non-volatile memory device.

11. The method of claim 1, wherein the memory controller provides a sector selection command and a sector address to the non-volatile memory device for selecting the at least one target sector.

12. A memory system, comprising:
    a non-volatile memory device; and
    a memory controller configured to control the non-volatile memory device,
    wherein the memory controller comprises:
        an error correction code block configured to read data from the non-volatile memory device in a unit of a page which includes a plurality of sectors, and configured to perform error correction decoding on the read data in a unit of a sector of the page; and
        a control block configured to select at least one target sector that includes at least one uncorrectable error, and to select at least one pass sector wherein all errors of the pass sector are correctable through the error correction decoding, the control block also being configured to control the nonvolatile memory device to inhibit precharging of bit lines connected to the at least one pass sector while precharging target bit lines connected to the at least one target sector, and the control block further being configured to perform a read retry operation for data in the at least one target sector.

13. The memory system of claim 12, wherein the error correction block provides to the control block a flag signal which indicates success or failure of the error correction decoding performed for each sector.

14. The memory system of claim 13, wherein the control block comprises a sector table that stores a sector number of the sectors and flag signals for the sectors.

15. The memory system of claim 12, wherein the flash memory device includes control logic, wherein the control logic includes a register that stores sector size information included in a set feature command provided from the memory controller, and wherein the control logic sets sizes of the sectors according to the sector size information.

16. A method of operating a memory system including a non-volatile memory device and a memory controller controlling the non-volatile memory device, wherein the memory device includes a plurality of memory cells organized into a plurality of pages each of which includes a plurality of sectors for storing data therein, the method comprising:
    reading data from a selected page of the non-volatile memory device;
    performing error correction decoding on the read data on a sector-by-sector basis for each of the sectors of the selected page; and
    when the error correction decoding is unable to correct at least one data error of at least one target sector of the selected page but is able to correct all data errors of one or more pass sectors of the selected page, transmitting a target sector selection command from the memory controller to the non-volatile memory device, wherein the target sector selection command causes the non-volatile memory device to:
- change a voltage to applied to the memory cells of the at least one target sector,
- precharge target bit lines connected to the at least one target sector while inhibiting precharging of bit lines connected to the one or more pass sectors, and
- perform a read retry operation for data stored in the at least one target sector with the changed voltage.

17. The method of claim 16, wherein each sector stores one or more parity bits generated based on the data stored in the sector, wherein a number of errors of the read data of the at least one target sector is greater than a number of the parity bits, and wherein a number of errors of the read data of each of the one or more pass sectors is less than or equal to the number of the parity data.

18. The method of claim 16, wherein the read retry operation for the read data of the at least one target sector is repeated until the error correction decoding is able to correct all data errors of the at least one target sector of the selected page, or a preset reference number of times, whichever occurs first.

19. The method of claim 18, further comprising performing an erase refresh operation to copy a memory block which includes the at least one target sector to another memory block when the read retry operation for the data stored in the at least one target sector is repeated more than the preset reference number of times and to erase the memory block which includes the at least one target sector.

20. The method of claim 16, wherein the at least one target sector is selected as the memory controller inputs a first pattern of data into memory cells included in the at least one target sector and inputs a different pattern of data input into memory cells of the one or more pass sectors.

* * * * *